US006967611B2

(12) United States Patent
Atriss et al.

(10) Patent No.: US 6,967,611 B2
(45) Date of Patent: Nov. 22, 2005

(54) OPTIMIZED REFERENCE VOLTAGE GENERATION USING SWITCHED CAPACITOR SCALING FOR DATA CONVERTERS

(75) Inventors: Ahmad H. Atriss, Chandler, AZ (US); Steven P. Allen, Mesa, AZ (US); Douglas A. Garrity, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 10/804,453

(22) Filed: Mar. 19, 2004

(65) Prior Publication Data

US 2005/0219097 A1  Oct. 6, 2005

(51) Int. Cl.[7] .............................................. H03M 1/12
(52) U.S. Cl. ...................... 341/172; 341/155; 341/161; 341/162; 341/163
(58) Field of Search ................................ 341/155, 159, 341/161–163, 172

(56) References Cited

U.S. PATENT DOCUMENTS

| 4,691,190 | A |   | 9/1987  | Robinson |         |
|-----------|---|---|---------|----------|---------|
| 5,017,920 | A |   | 5/1991  | French   |         |
| 5,416,485 | A |   | 5/1995  | Lee      |         |
| 5,574,457 | A | * | 11/1996 | Garrity et al. | 341/172 |
| 5,644,313 | A |   | 7/1997  | Rakers et al. |   |
| 5,784,016 | A |   | 7/1998  | Nagaraj  |         |
| 6,016,115 | A | * | 1/2000  | Heubi    | 341/161 |
| 6,320,530 | B1 | * | 11/2001 | Horie   | 341/163 |
| 6,362,770 | B1 | * | 3/2002  | Miller et al. | 341/172 |
| 6,535,157 | B1 | * | 3/2003  | Garrity et al. | 341/163 |
| 6,870,495 | B1 | * | 3/2005  | Zadeh et al. | 341/161 |

FOREIGN PATENT DOCUMENTS

WO    WO 03/023968 A2    3/2003

OTHER PUBLICATIONS

Related U.S. Appl. No. 10/631,450 filed Jul. 20, 2003.

* cited by examiner

*Primary Examiner*—Michael Tokar
*Assistant Examiner*—Khai Nguyen
(74) *Attorney, Agent, or Firm*—Robert L. King

(57) ABSTRACT

An algorithmic or cyclic data converter uses an RSD stage having a switched capacitor network for efficiently scaling at least one externally supplied reference voltage. A reference voltage is scaled by using capacitor ratios that also function to provide an output voltage used as a residue output of the RSD A/D converter. The residue is used to generate a bit value corresponding to the magnitude of the residue. Two RSD stages cycle back and forth generating a logic value each half clock cycle until the desired bit resolution is achieved. In one form, the RSD stage scales the externally supplied reference voltage only by factors of less than one. In another form, the RSD stage scales the reference voltage by any scaling factor. A reference voltage scaling circuit separate from the RSD stage is avoided.

41 Claims, 6 Drawing Sheets

US 6,967,611 B2

OPTIMIZED REFERENCE VOLTAGE GENERATION USING SWITCHED CAPACITOR SCALING FOR DATA CONVERTERS

RELATED APPLICATION

This application is related to:

U.S. patent application Ser. No. 10/631,450, entitled "Space Efficient Low Power Cyclic A/D Converter" filed Jul. 30, 2003, and assigned to the assignee hereof.

TECHNICAL FIELD OF INVENTION

The present invention generally relates to semiconductor circuits, and more particularly relates to data conversion.

BACKGROUND OF INVENTION

Digital signal processing has been proven to be very efficient in handling and manipulating large quantities of data. There are many products that are in common use such as wireless devices, digital cameras, motor controllers, automobiles, and toys, to name a few, that rely on digital signal processing to operate. Many of these products continuously receive information that is monitored and used to produce adjustments to the system thereby maintaining optimum performance. The data is often an analog signal that must be converted to a representative digital signal. For example, light intensity, temperature, revolutions per minute, air pressure, and power are but a few parameters that are often measured. Typically, an analog to digital (A/D) converter is the component used to convert an analog signal to a digital signal. In general, the conversion process comprises periodically sampling the analog signal and converting each sampled signal to a corresponding digital signal.

Many applications require the analog to digital converter(s) to sample at high data rates, operate at low power, and provide high resolution. These requirements are often contradictory to one another. Furthermore, cost is an important factor that directly correlates to the amount of semiconductor area needed to implement a design. One type of analog to digital converter that has been used extensively is a redundant signed digit (RSD) analog to digital converter. The RSD analog to digital converter typically comprises one or more RSD stages and a sample/hold circuit. In one embodiment, a sampled voltage is compared against a high reference voltage and a low reference voltage. The result of the comparison is used to determine a bit (1 or 0) from the RSD stage. A residue voltage is then generated that relates to the sampled voltage less the voltage value of the extracted bit. The residue voltage is then provided to another RSD stage or fed back in a loop to continue the conversion process to extract bits until the least significant bit is generated.

In most applications, the analog signal that is to be converted is a single ended signal and can have values ranging from ground to the supply voltage. The A/D converter RSD circuitry in turn uses differential signaling to provide noise isolation, increase dynamic range, reduce errors due to charge injection and improve power supply noise rejection. The differential signaling must be in the operational range of the A/D converter sub functions which is less than the supply voltage and more than ground potential. The purpose of the sample and hold function is to convert the full range analog input signal into a scaled differential signal during the sampling process. For the A/D converter RSD circuitry to perform a conversion on the scaled input signal, it must use a voltage reference that has been scaled appropriately. Circuits that are used to scale a reference voltage typically use a resistor ladder. The reference voltage is buffered and then filtered using bypass capacitors for noise considerations. Such circuits introduce a number of problems that result in a mis-match in scaling between the reference generator and the interface function. This mis-match, between the two scaling functions results in either an A/D converter transfer gain error, transfer offset error or both. Additionally, the scaled output voltages require large capacitors that are typically required to be implemented external to an integrated circuit chip due to their required size. Therefore, additional integrated circuit pin count must be dedicated to implement the scaling function. As a result, the generation of scaled reference voltages for use in an RSD data converter introduces error, requires additional circuitry and package support pins.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
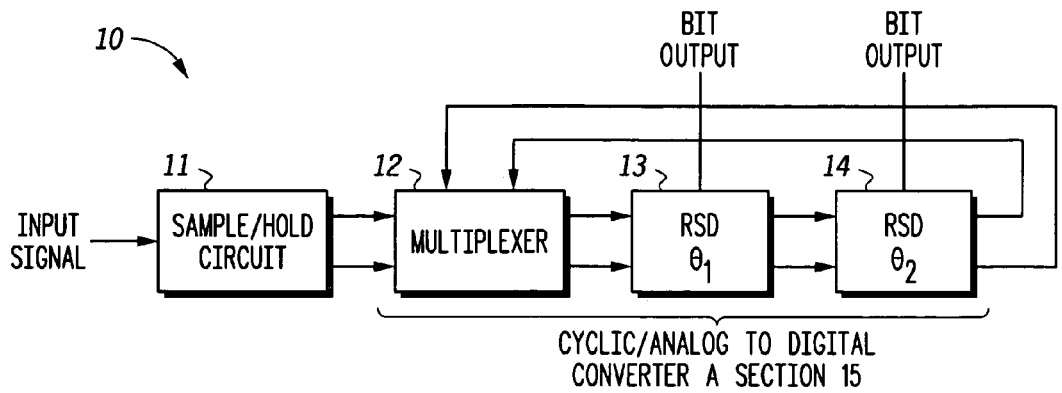
FIG. 1 is a block diagram of a prior art redundant signed digit (RSD) cyclical analog to digital converter.

FIG. 1 is a block diagram of a prior art redundant signed digit (RSD) cyclical analog to digital converter 10 having two RSD stages. In general, RSD cyclical analog to digital converter 10 is a clocked system that samples an analog voltage and generates an N-bit digital word representing the sampled analog voltage, where N is an integer. The number of bits (N) of the digital word corresponds to the resolution of the conversion process and is chosen based on the application requirements. Typically, the complexity, size, and power of the converter increase with speed of conversion and resolution.

While FIG. 1 illustrates an RSD cyclical analog to digital converter having two RSD stages, it should be apparent that the novel switched capacitor networks and amplifiers described herein may be implemented in various types of A/D converters. For example, any type of algorithmic converter from a single stage cyclic to an N-stage pipelined A/D converter may be used in connection with the novel switched capacitor networks and amplifiers described herein.

RSD cyclical analog to digital converter 10 is suitable for many different types of applications and is widely used. RSD cyclical analog to digital converter 10 comprises sample/hold circuit 11 and a cyclic analog to digital converter section 15. Sample/hold circuit 11 has an input and a differential output. Sample/hold circuit 11 often performs many tasks. In one embodiment, sample/hold circuit 11 samples a single-ended analog voltage applied to the input and converts and scales the single-ended analog voltage to a differential voltage. When sampling a signal that can swing from the supply voltage to ground scaling is required to reduce the sampled analog voltage to a scaled valued that can be handled by cyclic analog to digital converter section 15. Converting to the differential voltage provides increased noise immunity for the rest of the conversion process.

Cyclic analog to digital converter section 15 comprises a multiplexer 12, a redundant signed digit (RSD) stage 13, and a redundant signed digit (RSD) stage 14. The multiplexer 12 has a first differential input coupled to the differential output of sample/hold circuit 11, a second differential input, and a differential output. RSD stage 13 has a differential input coupled to the differential output of multiplexer 12, a bit output, and differential output. RSD stage 14 has a differential input coupled to the differential output of RSD stage 13, a bit output, and a differential output coupled to the second differential input of multiplexer 12.

Operation of RSD cyclical analog to digital converter 10 begins with the input signal being sampled, scaled and converted to a differential signal by sample/hold circuit 11. Sample/hold circuit 11 provides the differential signal to cyclic analog to digital converter section 15. Multiplexer 12 couples the differential signal to RSD stage 13 where a first bit is extracted from the differential signal and provided at the bit output of RSD stage 13. The first bit (1 or 0) of the digital word representing the sampled input signal is stored. In an embodiment of RSD cyclical analog to digital converter 10, RSD stage 13 extracts a bit during $\phi_1$ of a clock cycle.

During $\phi_2$ of a clock cycle, a residue is calculated by RSD stage 13 and provided to RSD stage 14 where a second bit (1 or 0) is extracted from the residue and provided at the bit output of RSD stage 14. The second bit of the digital word representing the sampled input signal is stored. The differential signal provided by sample/hold circuit 11 is not needed after RSD stage 13 has received and processed the information. Multiplexer 12 is switched at an appropriate time such that the differential output of RSD stage 14 is coupled through multiplexer 12 to the differential input of RSD stage 13.

Cyclic analog to digital converter section 15 is now coupled in a cyclic mode where RSD stages 13 and 14 extract and provide a bit respectively during $\phi_1$ and $\phi_2$ of each clock cycle. For example, continuing with the example above, RSD stage 14 calculates a residue during $\phi_1$ of the next clock cycle and provides the residue to RSD stage 13 where a third bit is extracted and provided at the bit output of RSD stage 13. The third bit is stored. The process continues during $\phi_2$ of the clock cycle where the fourth bit is extracted until the N bits of resolution of RSD cyclical analog to digital converter 10 have been generated corresponding to the initial sampled voltage wherein the input signal is sampled again to start another conversion process. Thus, a redundant signed digit cyclical analog to digital converter provides a nice compromise between power consumption, speed at which the conversion takes place, resolution, and chip area.

Figure 2:
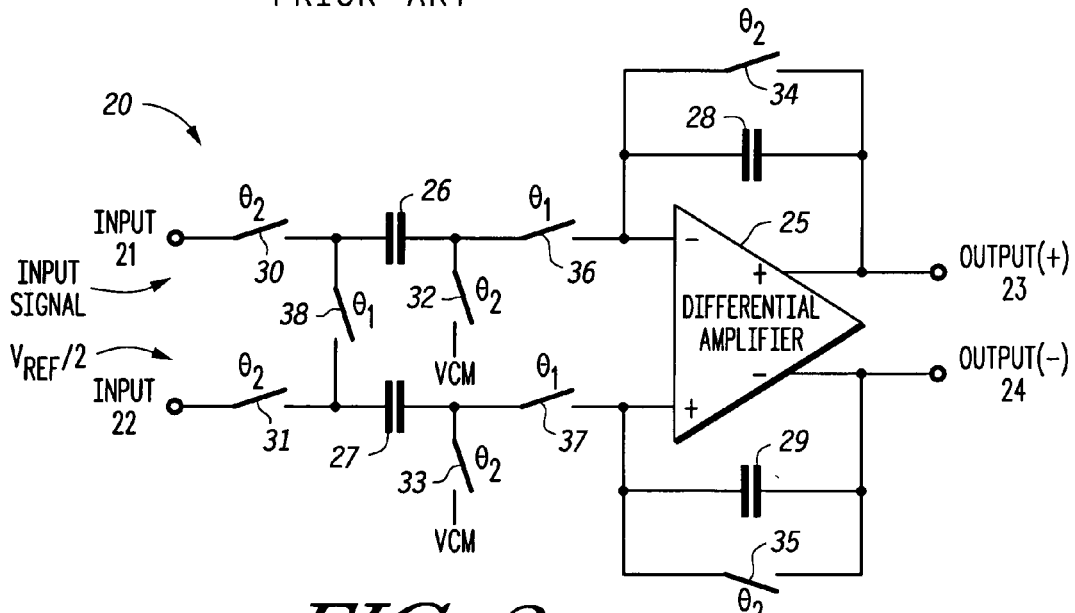
FIG. 2 is a schematic diagram of a prior art sample/hold circuit.

FIG. 2 is a schematic diagram of a prior art sample/hold circuit 20 that is capable of sampling a single-ended analog voltage, scaling the sampled voltage, and converting to the sampled single-ended analog voltage to a differential voltage. Sample/hold circuit 20 has an input 21, an input 22, an output 23, and an output 24. Sample/hold circuit 20 comprises a differential amplifier 25, capacitors 26–29, and switches 30–38. Switches 30–38 of sample/hold circuit 20 are primarily controlled by a clock signal. The phase of the clock signal indicating a closed switch is located by switches 30–38. Switches 30–38 are open during an opposite clock phase (not shown by each switch). The clock phase $\phi_2$ corresponds to a first half clock cycle and the clock phase $\phi_1$ corresponds to a second half clock cycle.

Sample/hold circuit 20 is configured to sample the input signal applied to input 21 during $\phi_2$ of the clock cycle. Switches 30–35 are closed during $\phi_2$ of the clock cycle. Switch 30 has a first terminal coupled to input 21 and a second terminal. Capacitor 26 has a first terminal coupled to the second terminal of switch 30 and a second terminal. Switch 32 has a first terminal coupled to the second terminal of capacitor 26 and a second terminal coupled for receiving a reference voltage VCM. Switch 31 has a first terminal coupled to input 22 and a second terminal. Capacitor 27 has a first terminal coupled to the second terminal of switch 31 and a second terminal. Switch 33 has a first terminal coupled to the second terminal of capacitor 27 and a second coupled for receiving a reference voltage VCM. Switch 34 has a first terminal coupled to a negative input of differential amplifier 25 and a second terminal coupled to the positive output of differential amplifier 25. Switch 35 has a first terminal coupled to a positive input of differential amplifier 25 and a second terminal coupled to the negative output of differential amplifier 25.

Capacitor 26 stores a difference voltage between the input signal applied to input 21 and the reference voltage VCM. Similarly, capacitor 27 stores a difference voltage between a reference voltage $V_{ref}/2$ and the reference voltage VCM. The voltages stored on capacitors 26 and 27 during $\phi_2$ are used to scale and convert the single-ended signal analog signal applied to input 21 to a differential signal.

Capacitors 26 and 27 are decoupled respectively from input 21 and input 22 when the clock signal changes phase from $\phi_2$ to $\phi_1$. Switches 30–35 are now open and switches 36–38 are now closed. Switch 38 has a first terminal coupled to the first terminal of capacitor 26 and a second terminal coupled to the first terminal of capacitor 27. Switch 36 has a first terminal coupled to the second terminal of capacitor 26 and a second terminal coupled to the negative input of differential amplifier 25. Switch 37 has a first terminal coupled to the second terminal of capacitor 26 and a second terminal coupled to the positive input of differential amplifier 25. Capacitors 26 and 27 are placed in series between the positive and negative inputs of differential amplifier 25. Capacitor 28 has a first terminal coupled to the negative input of differential amplifier 25 and a second terminal coupled to the positive output of differential amplifier 25. Capacitor 29 has a first terminal coupled to the positive input of differential amplifier 25 and a second terminal coupled to the negative output of differential amplifier 25.

Differential amplifier 25 scales and produces a differential signal corresponding to the single-ended analog signal that was sampled during $\phi_2$ of the clock cycle. Differential amplifier 25 scales corresponding to a ratio of capacitors 26 and 28 and capacitors 27 and 29 during $\phi_1$ of the clock cycle. The voltage being amplified is the net voltage across series connected capacitors 26 and 27. The differential voltage output is provided at outputs 23 and 24.

Figure 3:
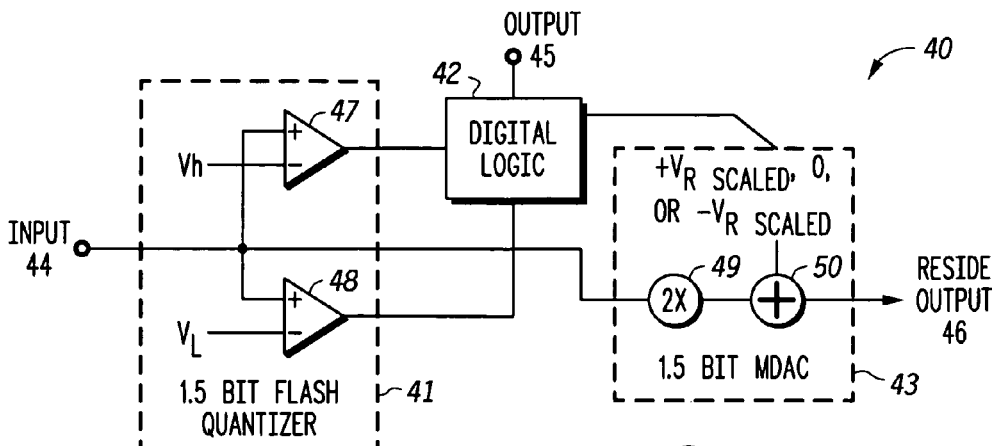
FIG. 3 is a block diagram of a redundant signed digit (RSD) stage.

FIG. 3 is a block diagram of a redundant signed digit (RSD) stage 40. RSD stage 40 includes a 1.5 bit flash quantizer 41, digital logic 42, and a 1.5 bit multiplying digital to analog converter (MDAC) 43. RSD stage 40 has an input 44, a bit output 45, and a residue output 46. RSD stage 40 produces a logic bit (1 or 0) depending on the magnitude of an input signal and calculates a residue. The residue is the remainder of the input signal less the value of the logic bit produced by RSD stage 40. The residue is typically the input signal to the next RSD stage. In general, the residue is amplified by a factor of two to allow 1.5 bit flash quantizer 41 to be the same for each RSD stage used. The creation of the digital word corresponding to a sampled voltage is generated by a RSD analog to digital converter by sequentially generating bits from the most significant bit (MSB) to the least significant bit (LSB).

RSD stage 40 is a 1.5 bit stage where 0.5 bit redundancy is used for digital correction to reduce comparator (offset) requirements. RSD stage 40 immediately generates an output bit upon receiving an input signal or residue. Digital logic 42 and 1.5 bit flash quantizer 41 determines whether the magnitude of the input signal corresponds to a logic one or a logic zero. 1.5 bit flash quantizer 41 comprises a comparator 47 and a comparator 48. Comparator 47 has a positive input coupled to input 44, a negative input coupled to a reference voltage $V_h$ and an output. Comparator 47 outputs a logic one if the input signal applied to input 44 is greater than $V_h$ and outputs a logic zero if the input signal is less than $V_h$. Comparator 48 has a positive input coupled to input 44, a negative input coupled to a reference voltage $V_L$ and an output. Comparator 48 outputs a logic one if the input signal applied to input 44 is greater than $V_L$ and outputs a logic zero if the input signal is less than $V_L$. Digital logic 42 has a first input coupled to the output of comparator 47, a second input coupled to the output of comparator 48, a first output coupled to bit output 45, and a second output. Three possible outputs can be generated from comparators 47 and 48 to digital logic 42. Digital logic 42 immediately provides a logic value to bit output 45 corresponding to the input signal magnitude.

The 1.5 bit multiplying analog to digital converter (MDAC) 43 is the core of RSD stage 40. The 1.5 bit MDAC 43 calculates the analog residue signal that is typically used as the input signal of the next RSD stage. As mentioned previously, the residue is amplified (typically by a factor of 2) by 1.5 bit MDAC 43. The 1.5 bit MDAC 43 has an amplification stage 49 and a sum stage 50. Amplification stage 49 has an input coupled to input 44 and an output. Sum stage 50 has a first input coupled to the output of amplification stage 49 and a second input coupled to the second output of digital logic 42, and an output coupled to residue output 46.

The speed at which RSD stage 40 operates, in part, is related to the performance of amplification stage 49. Typically, RSD stage 40 operates within a clock cycle whereby the bit value of the sampled input signal is provided at output bit 45 during a first phase of a clock cycle and the residue is calculated and provided at residue output 46 during a second phase of a clock cycle. The speed of operation is often limited by the settling time of the amplifier used in amplification stage 49. The output of amplification stage 49 must settle before a time period equal to a half clock cycle. Settling time is a function of slew rate and the gain bandwidth of the amplifier. In general, the amplifier used in amplification stage 49 is a high quality amplifier design that takes up significant wafer area and often consumes a substantial amount of the integrated circuit total power dissipation.

Sum stage 50 sums the signal received from amplification stage 49 and digital logic 42. Digital logic 42 provides one or a voltage $+V_{r\ scaled}$, 0, or minus $V_{r\ scaled}$ to sum stage 50. The value provided by digital logic 42 is determined by the output from comparators 47 and 48. The accuracy of the conversion process is greatly impacted by the ability of 1.5 bit MDAC 43 to calculate the residue.

In operation, the purpose of the 1.5 bit MDAC 43 is to double the incoming signal and perform one of three operations. The 1.5 bit MDAC 43 either subtracts a $V_{R\ scaled}$, adds a $V_{R\ scaled}$ or passes the double input signal, $2V_{in}$, on to a next RSD stage. The 1.5 bit flash quantizer 41 of FIG. 3 determines which operation is to be performed. If the incoming input 44 is below the $V_L$ switching voltage of the 1.5 bit flash quantizer 41, then $V_{R\ scaled}$ is added to $2V_{IN}$ before being passed to the next RSD stage. If the incoming input 44 is between $V_L$ and $V_H$ of the 1.5 bit flash quantizer 41, then no addition or subtraction of $V_{R\ scaled}$ takes place and $2V_{IN}$ is passed on to the next RSD stage. If the incoming signal is greater than $V_H$, of the 1.5 bit flash quantizer 41, then $V_{R\ scaled}$ is subtracted from $2V_{IN}$ before being passed onto the next RSD stage. The term $V_{R\ scaled}$ is the reference voltage that has been scaled to match the full range of the input signal that has been scaled by the sample and hold circuit 11 of FIG. 1. Typically a circuit that is implemented external to an integrated circuit containing an RSD A/D converter because large capacitors are required and are not efficiently implemented on the integrated circuit.

Figure 4:
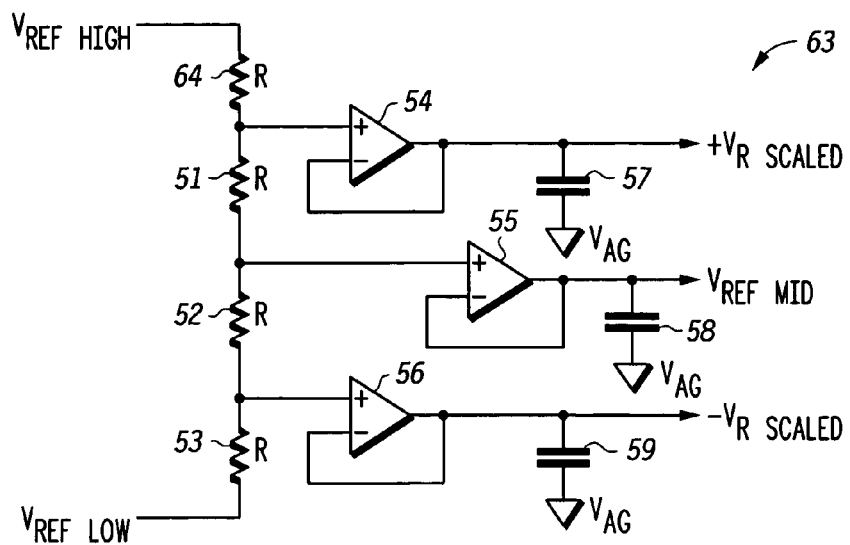
FIG. 4 is a partial schematic diagram of a prior art voltage scaling circuit.

Illustrated in FIG. 4 is a conventional scaling circuit 63. A high reference voltage, Vref High, is scaled relative to a low reference voltage, Vref Low. A plurality of series-connected resistors 64 and 51–53, each having a resistance R, is connected in series. A first terminal of resistor 64 is connected to Vref High, and a second terminal of resistor 64 is connected to both a positive or non-inverting input of a differential amplifier 54 and to a first terminal of resistor 51. A second terminal of resistor 51 is connected to both a positive or non-inverting input of a differential amplifier 55 and to a first terminal of a resistor 52. A second terminal of resistor 52 is connected to both a positive or non-inverting input of a differential amplifier 56 and to a first terminal of resistor 53. A second terminal of resistor 53 is connected to the Vref Low reference voltage. An output of differential amplifier 54 provides the scaled reference voltage $V_{R\ scaled}$ and is connected to a negative or inverting input thereof and to a first electrode of a capacitor 57. A second electrode of capacitor 57 is connected to an analog ground reference voltage, $V_{AG}$. An output of differential amplifier 55 provides an intermediate scaled reference voltage $V_{Ref\ Mid}$ and is connected to a negative or inverting input thereof and to a first electrode of a capacitor 58. A second electrode of capacitor 58 is connected to an analog ground reference voltage, $V_{AG}$. An output of differential amplifier 56 provides a scaled negative reference voltage $-V_{R\ scaled}$ and is connected to a negative or inverting input thereof and to a first electrode of a capacitor 59. A second electrode of capacitor 59 is connected to an analog ground reference voltage, $V_{AG}$.

In operation, scaling circuit 63 uses resistors for scaling the reference voltage followed by buffer amplifiers to drive one of the scaled reference voltages into the RSD stages, such as RSD stage 40 of FIG. 3. Scaling circuit 63 consumes a significant amount of power and circuit die area while introducing a source of gain and offset error into the overall performance of the A/D converter. As will be explained below, as a significant improvement the scaled voltage is generated without the use of a separate scaling circuit to improve power, reduce circuit area and improve accuracy of the A/D converter.

Figure 5:
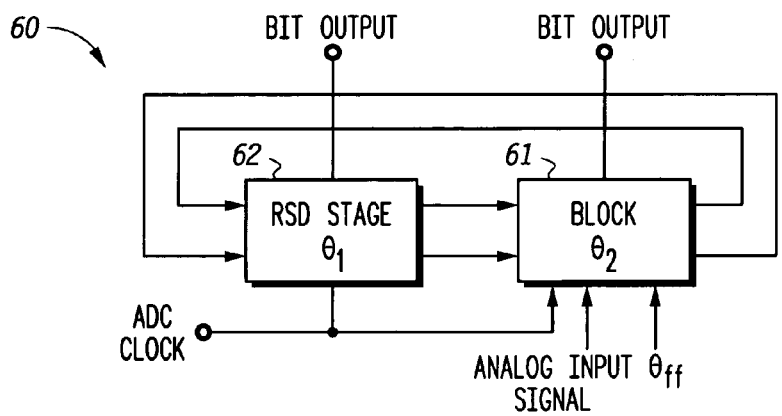
FIG. 5 is a block diagram of a two stage redundant (RSD) cyclical analog to digital converter in accordance with the present invention.

FIG. 5 is a block diagram of a two stage redundant signed digit (RSD) cyclical analog to digital converter 60 in accordance with the present invention. RSD cyclical analog to digital converter 60 has a block 61 and a RSD stage 62. Block 61 has a differential input, an input coupled for receiving an analog input signal, a control input for receiving a $\theta_{ff}$ signal, a clock input coupled for receiving an analog to digital converter (ADC) clock signal, a bit output, and a differential output. RSD stage 62 has a differential input coupled to the differential output of block 61, a clock input coupled for receiving the ADC clock signal, a bit output, and a differential output coupled to the differential input of block 61.

RSD cyclical analog to digital converter 60 reduces both power and area when compared to a standard RSD analog to digital converter. In particular, RSD cyclical analog to digital converter 60 combines the functions of the sample/hold circuit and the second RSD stage into a block 61. The sample/hold circuit is used only once per conversion cycle yet takes up almost a third of the space and power of a RSD analog to digital converter. RSD cyclical analog to digital converter 60 takes advantage of the fact that the logic bit value and the residue are generated during different phases of the clock signal. RSD stage 62 is used to generate the first logic value or the most significant bit (MSB). Thus, block 61 is configured as a sample/hold circuit to provide RSD stage 62 with a sampled signal thereby generating the first logic value. Block 61 is then reconfigured as a second RSD stage as RSD stage 62 calculates a residue. It should be noted that at least one component in block 61 is shared between the sample/hold circuit and RSD stage configurations of block 61. The timing of this configuration-reconfiguration process will be described in more detail below.

In general, block 61 is configured to a sample/hold circuit when enabled by the $\theta_{ff}$ signal. The sample/hold circuit, samples, scales, and converts a sampled single-ended analog signal to a differential signal. The differential output of block 61 provides the differential signal to RSD stage 62 for determining a first logic bit value (most significant bit) that is provided at the bit output of RSD stage 62.

Figure 6:
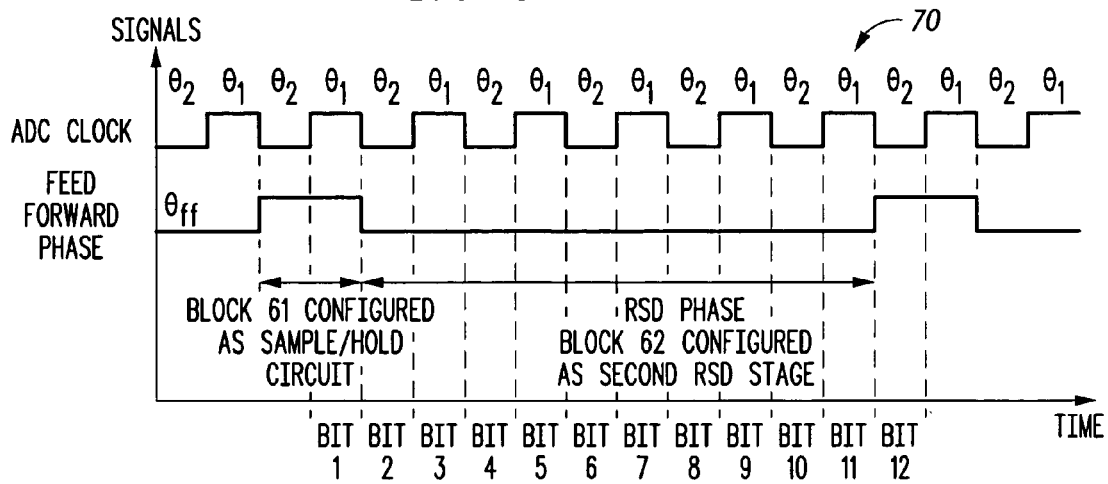
FIG. 6 is a timing diagram for the two stage redundant (RSD) cyclical analog to digital converter of FIG. 5.

FIG. 6 is a timing diagram 70 for the two stage redundant (RSD) cyclical analog to digital converter of FIG. 5. Timing diagram 70 is a conversion process that generates a 12 bit digital word corresponding to a sampled analog signal. The resolution of the conversion is a function of the number of clock cycles used. The analog to digital converter (ADC) clock signal is shown having a phase $\theta_1$ and a phase $\theta_2$.

Referring to FIG. 5, the $\theta_1$ on RSD stage 62 indicates that a logic bit value is provided at the bit output of RSD stage 62 on the phase $\theta_1$ of the clock signal. Similarly, the $\theta_2$ on block 61 indicates that a logic bit value is provided at the bit output of block 61 on the phase $\theta_2$ of the clock signal.

Referring back to FIG. 6, the $\theta_{ff}$ signal transitioning to a high logic state begins a conversion process. In one embodiment, the $\theta_{ff}$ signal is in the high logic state for a full ADC clock signal. The $\theta_{ff}$ signal configures block 61 to a sample/hold circuit. The sample/hold circuit samples the analog input signal during the first half ($\theta_2$) of the $\theta_{ff}$ signal. In an embodiment of the sample/hold circuit, the sampled single-ended analog voltage is scaled and converted to a differential signal during the second half ($\theta_1$) of the $\theta_{ff}$ signal. The differential signal is immediately provided from block 61 (FIG. 5) to RSD stage 62 (FIG. 5) where the first logic value (bit 1) is generated and output on the bit output of RSD stage 62 (FIG. 5). As shown, this occurs during $\theta_1$ while the $\theta_{ff}$ signal is in a high logic state. In general, a logic bit value is generated each half clock of the ADC clock signal.

The $\theta_{ff}$ signal transitions to a low logic state during the phase $\theta_2$ of the next ADC clock signal. Block 61 is configured from the sample/hold circuit to a RSD stage. Block 61 stays as the RSD stage during the conversion process. RSD stage 62 (FIG. 5) calculates a residue and provides the residue to the newly reconfigured RSD stage of block 61. The RSD stage of block 61 (FIG. 5) immediately outputs the second logic value (bit 2) on the bit output of block 61 (FIG. 4). The RSD stage of block 61 (FIG. 5) then calculates a residue during the next phase $\theta_1$ of ADC clock signal. The residue from the RSD stage of block 61 is provided to RSD stage 62 (FIG. 5) where a third logic value is generated and output. Thus, the generation of a logic value and calculating a residue occurs back and forth between RSD stage 62 (FIG. 5) and the RSD stage of block 61.

As mentioned previously, the timing diagram illustrates a 12 bit conversion. The $\theta_{ff}$ signal transitions from the low logic state to a high logic state after the eleventh logic value (bit 11) is generated. The $\theta_{ff}$ signal transitions to the high logic state during a phase $\theta_2$ of the ADC clock signal. Block 61 (FIG. 5) is reconfigured from the RSD stage to the sample/hold circuit when the $\theta_{ff}$ signal transitions to the high logic state. On going with the reconfiguration of block 61 (FIG. 5), is the calculation of the residue by RSD stage 62 (FIG. 5). The residue from RSD stage 62 is provided to block 61 (FIG. 5) where the twelfth logic value (bit 12) is generated and provided at the bit output of block 61. The reason why the logic value can be generated by block 61 (FIG. 5) while it is being configured as a sample/hold circuit is that the circuitry pertaining to determine the logic value is unaffected by the configuration change. In one embodiment, most of the change occurs in the circuitry involved with the calculation of the residue which is not needed after the least significant bit is generated.

Figure 7:
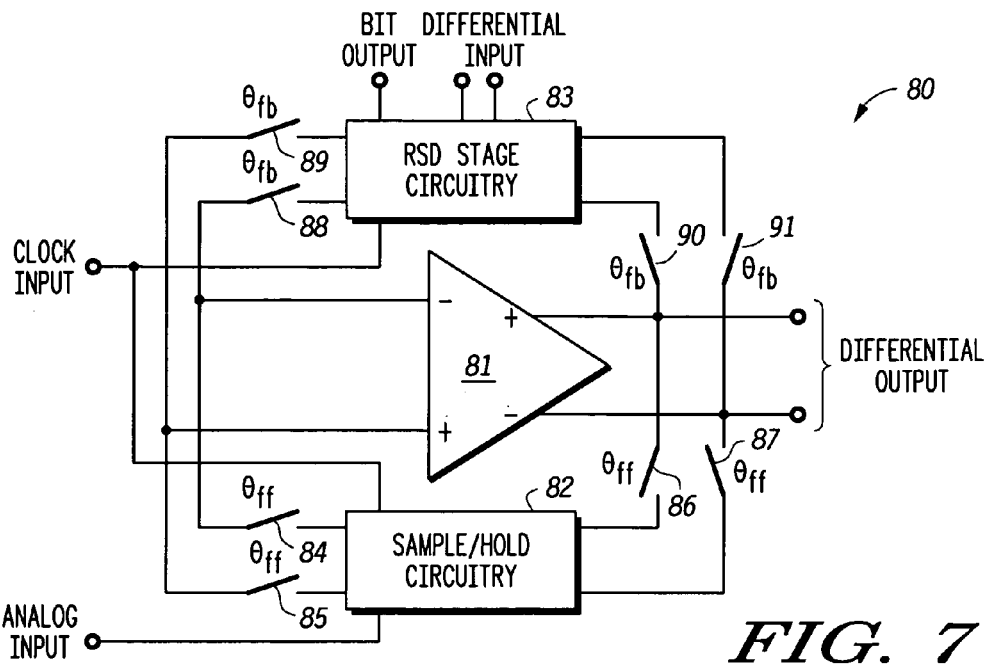
FIG. 7 is a block that is configurable to both a sample/hold circuit and a RSD stage in accordance with the present invention.

FIG. 7 is a block 80 that is configurable to both a sample/hold circuit and a redundant signed digit (RSD) stage in accordance with the present invention. Block 80 is one embodiment of block 61 of FIG. 5. In particular, block 80 switchably couples an amplifier 81 for use with the sample/hold circuit and the RSD stage. In this embodiment, no other circuitry is shared other than amplifier 81 for the two different circuit configurations. In general, a sample/hold circuit and a RSD stage both require a high performance amplifier. An amplifier takes up a substantial amount of chip area and is a significant source of power dissipation. Sharing an amplifier for both the sample/hold circuit and the RSD stage produces a large area and power savings for an analog to digital converter. For example, it is possible to reduce the size and power dissipation of a two stage RSD cyclical analog to digital converter by approximately 33% using shared components.

Block 80 includes amplifier 81, sample/hold circuitry 82, RSD stage circuitry 83, and switches 84–91. Block 80 has a clock input for receiving a clock signal, an analog input for receiving an analog signal, a bit output, a differential output, a control input $\theta_{ff}$ (not shown), and a control input $\theta_{fb}$ (not shown). In an embodiment of block 80, sample/hold circuitry 82 comprises components such as switches and capacitors that are commonly used around a high performance amplifier to sample a single-ended analog signal, scale, and convert to a differential signal. Similarly, RSD stage circuitry 83 comprises components such as switches, capacitors, and digital logic that when placed around amplifier 81 produce a logic value corresponding to a sampled input signal and calculates a residue.

Sample/hold circuitry 82 has a first input coupled to the analog input, a second input coupled to the clock input, a first terminal, a second terminal, a third terminal, and a fourth terminal. Switch 84 has a first terminal coupled to the first terminal of sample/hold circuitry 82 and a second terminal coupled to a negative input of amplifier 81. Switch 85 has a first terminal coupled to the second terminal of sample/hold circuitry 82 and a second terminal coupled to a positive input of amplifier 81. Switches 84 and 85 couple sample/hold circuitry 82 to the differential inputs of amplifier 81. Switch 86 has a first terminal coupled to the third terminal of sample/hold circuitry 82 and a second terminal coupled to a positive output of amplifier 81. Switch 87 has a first terminal coupled to the fourth terminal of sample/hold circuit 82 and a second terminal coupled to a negative output of amplifier 81. Switches 86 and 87 couple sample/hold circuitry 82 to the differential outputs of amplifier 81.

Switches 84–87 are enabled by a $\theta_{ff}$ control signal applied to the $\theta_{ff}$ control input of block 80. The $\theta_{ff}$ control signal couples the sample/hold circuitry to amplifier 81. In an embodiment of block 80, the $\theta_{ff}$ control signal is enabled for a clock cycle of a clock signal applied to the clock input. A $\theta_{fb}$ signal is in a logic state that disables switches 88–91. A sample of the analog signal applied to the analog input is taken during a first phase of the clock cycle when switches 84–87 are enabled. A scaled differential signal corresponding to the sampled analog signal is provided at the differential output of block 80 during the second phase of the clock cycle when switches 84–87 are enabled.

RSD stage circuitry 83 has an input coupled to the clock input, a differential input coupled to the differential input of block 80, a first terminal, a second terminal, a third terminal, a fourth terminal, and a bit output. Switch 88 has a first terminal coupled to the first terminal of RSD stage circuitry 83 and a second terminal coupled to the negative input of amplifier 81. Switch 89 has a first terminal coupled to the second terminal of RSD stage circuitry 83 and a second terminal coupled to the positive input of amplifier 81. Switches 88 and 89 coupled RSD stage circuitry 83 to the differential inputs of amplifier 81. Switch 90 has a first terminal coupled to the third terminal of RSD stage circuitry 83 and a second terminal coupled to the positive output of amplifier 81. Switch 91 has a first terminal coupled to the fourth terminal of RSD stage circuitry 83 and a second terminal coupled to the negative output of amplifier 81. Switches 90 and 91 couple RSD stage circuitry 83 to the differential outputs of amplifier 81.

Switches 88–91 are enabled by a $\theta_{fb}$ control signal applied to the $\theta_{fb}$ control input of block 80. The $\theta_{fb}$ control signal couples the RSD stage circuitry 83 to amplifier 81. In an embodiment of block 80, the $\theta_{fb}$ control signal is typically enabled for multiple clock cycles or until the analog to digital conversion process is completed. The $\theta_{ff}$ signal is in a logic state that disables switches 84–87 and $\theta_{fb}$ signals are typically enabled at this time. In an embodiment of block 80, a logic value is generated during a phase of the clock cycle when a differential signal is applied to the differential input of block 80 and the $\theta_{fb}$ signal enables switches 88–91. A residue is calculated and provided at the differential output of block 80 during a next phase of the clock cycle, and switches 88–91 are enabled.

Figure 8:
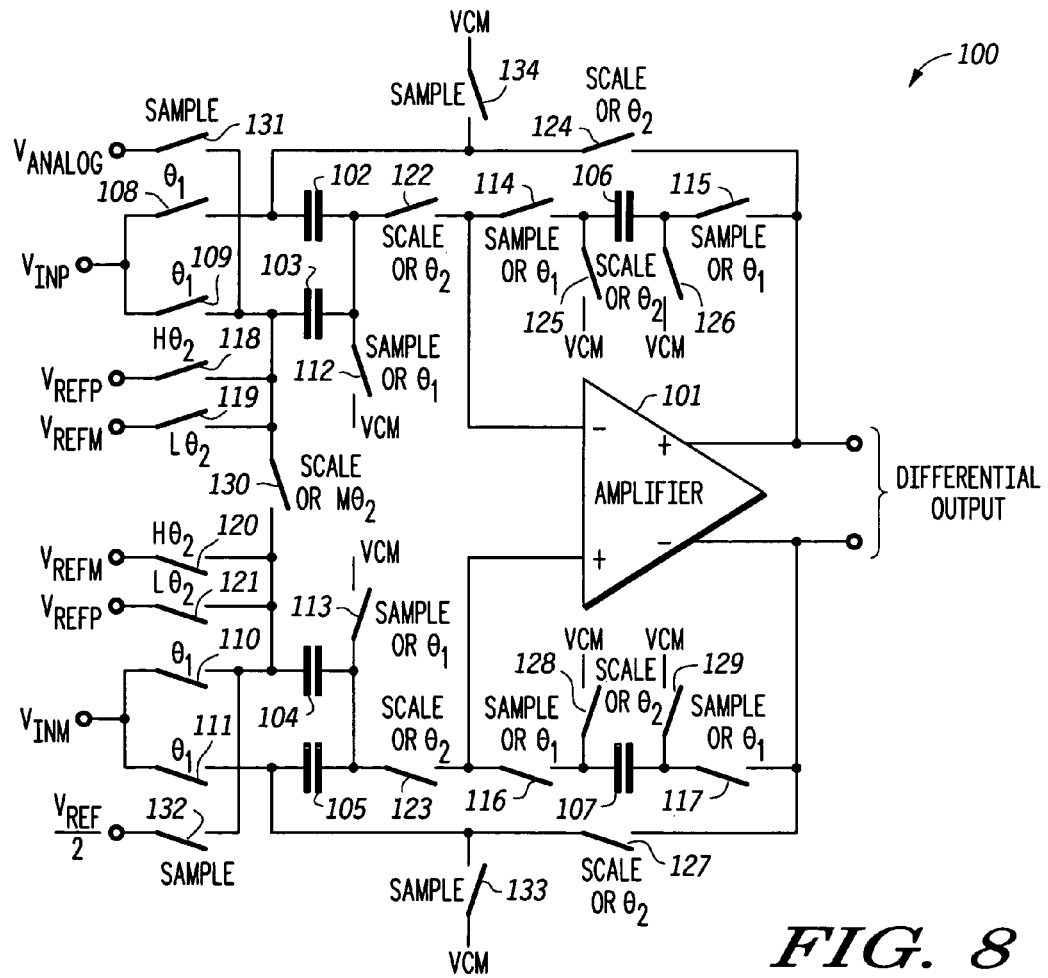
FIG. 8 is a schematic diagram of a configurable block in accordance with the present invention.

FIG. 8 is a schematic diagram of a configurable block 100 in accordance with the present invention. Configurable block 100 is configurable as a sample/hold circuit and a 1.5 bit multiplying digital-to-analog converter (MDAC). Typically, the MDAC takes up the majority of the silicon area of a redundant signed digit stage. Configurable block 100 is related to block 61 of FIG. 5 except that some components of a redundant signed digit stage, for example a flash quantizer and some digital logic are not shown to simplify the illustration since it is not among the shared circuitry of the two different circuit configurations (sample/hold circuit and 1.5 bit MDAC). In this embodiment, configurable block 100, unlike block 80 of FIG. 7, reuses more than the amplifier. Configurable block 100 shares other elements such as capacitors which take up a significant area in both the sample/hold circuit and the 1.5 bit MDAC thereby further increasing the area efficiency. Configurable block 100 has a first input coupled for receiving a $V_{analog}$ signal, a second input for receiving a $V_{refp}$ signal, a third input for receiving a $V_{refm}$ signal, a fourth input for receiving a $V_{inp}$ signal, a fifth input for receiving a $V_{inm}$ signal, a sixth input for receiving a VCM voltage, and a differential output. Configurable block 100 comprises an amplifier 101, capacitors 102–107, and switches 108–134. Switches 108–111 are enabled (closed) during a phase $\theta_1$ of a RSD stage2 clock signal. Switches 112–117 are enabled (closed) during the phase $\theta_1$ of the RSD stage2 clock signal or by a sample signal. Switches 118–121 are enabled (closed) during a phase $\theta_2$ of the RSD stage2 clock signal. Switches 122–129 are enabled (closed) during the phase $\theta_2$ of the RSD stage2 clock signal or by a scale signal. Switch 130 is enabled (closed) when both a signal $M\theta_2$ (is in an enable logic state) and the RSD stage2 clock signal is in the phase $\theta_2$. Switches 131–134 are enabled (closed) by the sample signal. The enabling signal is indicated in FIG. 8 by each of the switches 108–134.

Configurable block 100 is configured to sample when switches 112–117 and switches 131–134 are enabled. Switch 131 has a first terminal coupled to the first input ($V_{Ref}/2$ signal) of configurable block 100 and a second terminal. A capacitor 103 has a first terminal coupled to the second terminal of switch 131 and a second terminal. A switch 112 has a first terminal coupled to the second terminal of capacitor 103 and a second terminal coupled to the sixth input (VCM voltage) of configurable block 100. A capacitor 102 has a first terminal coupled to the first terminal of switch 112 and a second terminal. A switch 134 has a first terminal coupled to the second terminal of capacitor 102 and a second terminal coupled to the sixth input (VCM voltage) of configurable block 100.

Switch 132 has a first terminal coupled to the first input ($V_{analog}$ signal) of configurable block 100 and a second terminal. A capacitor 104 has a first terminal coupled to the second terminal of switch 132 and a second terminal. A switch 113 has a first terminal coupled to the second terminal of capacitor 104 and a second terminal coupled to the sixth input (VCM voltage) of configurable block 100. A capacitor 105 has a first terminal coupled to the first terminal of switch 113 and a second terminal. A switch 133 has a first terminal coupled to the second terminal of capacitor 105 and a second terminal coupled to the sixth input (VCM voltage) of configurable block 100.

Switch 114 has a first terminal coupled to a negative input of amplifier 101 and a second terminal. Capacitor 106 has a first terminal coupled to the second terminal of switch 114 and a second terminal. Switch 115 has a first terminal coupled to the second terminal of capacitor 106 and a second terminal coupled to the output a positive input of amplifier 101. Switch 116 has a first terminal coupled to a positive input of amplifier 101 and a second terminal. Capacitor 107 has a first terminal coupled to the second terminal of switch 116 and a second terminal. Switch 117 has a first terminal coupled to the second terminal of capacitor 107 and a second terminal coupled to a negative output of amplifier 101.

Configurable block 100 is configured to scale and provide a differential voltage corresponding to a sampled analog signal when switches 122–129 are enabled. Switch 122 has a first terminal coupled to the negative input of amplifier 101 and a second terminal coupled to the first terminal of switch 112. Switch 124 has a first terminal coupled to the first terminal of switch 134 and a second terminal coupled to the positive output of amplifier 101. Switch 125 has a first terminal coupled to the first terminal of capacitor 106 and a second terminal coupled to the sixth input (VCM voltage) of configurable block 100. Switch 126 has a first terminal coupled to the second terminal of capacitor 106 and a second terminal coupled to the sixth input (VCM voltage) of configurable block 100.

Switch 123 has a first terminal coupled to the positive input of amplifier 101 and a second terminal coupled to the first terminal of switch 113. Switch 127 has a first terminal coupled to the second terminal of capacitor 105 and a second terminal coupled to the negative output of amplifier 101. Switch 128 has a first terminal coupled to the first terminal of capacitor 107 and a second terminal coupled to the sixth input (VCM voltage) of configurable block 100. Switch 129 has a first terminal coupled to the second terminal of capacitor 107 and a second terminal coupled to the sixth input (VCM voltage) of configurable block 100.

After sampling, scaling, and converting an input analog signal to a differential signal, configurable block 100 is configured as a 1.5 bit MDAC and works in conjunction with other circuitry to form a redundant signed bit (RSD) stage of an analog to digital (A/D) converter that participates in an analog to digital conversion. In an embodiment of configurable block 100, the RSD stage is a second RSD stage of a two stage RSD analog to digital converter. In general, configurable block 100 as the second RSD stage generates a logic bit value corresponding to the magnitude of a differential input signal during a phase $\theta_1$ of the RSD stage2 clock signal. The second RSD stage then generates a residue during a phase $\theta_2$ of the RSD stage2 clock signal.

Switches 108–117 are enabled when configurable block 100 is configured as a 1.5 bit MDAC and a logic bit value is being generated. Switch 108 has a first terminal coupled to the fourth input ($V_{inp}$ signal) of configurable block 100 and a second terminal coupled to the second terminal of capacitor 102. Switch 109 has a first terminal coupled to the fourth input ($V_{inp}$ signal) of configurable block 100 and a second terminal coupled to the first terminal of capacitor 103. Switch 112 has the first terminal coupled to the first terminal of capacitor 102 and the second terminal coupled to the sixth input (VCM voltage) of configurable block 100. Switch 114 has the first terminal coupled to a negative input of amplifier 101 and the second terminal coupled to the first terminal of capacitor 106. Switch 115 has the first terminal coupled to the second terminal of capacitor 106 and a second terminal coupled to the output a positive input of amplifier 101.

Switch 110 has a first terminal coupled to the fifth input ($V_{inm}$ signal) of configurable block 100 and a second terminal coupled to the first terminal of capacitor 104. Switch 111 has a first terminal coupled to the fifth input ($V_{inm}$ signal) of configurable block 100 and a second terminal coupled to the second terminal of capacitor 105. Switch 113 has the first terminal coupled to the second terminal of capacitor 104 and a second terminal coupled to the sixth input (VCM voltage) of configurable block 100. Switch 116 has the first terminal coupled to a positive input of amplifier 101 and the second terminal coupled to the first terminal of capacitor 107. Switch 117 has the first terminal coupled to the second terminal of capacitor 107 and the second terminal coupled to the negative output of amplifier 101.

Switches 118–129 are enabled when configurable block 100 is configured as a 1.5 bit MDAC and a residue is being generated. Switch 118 has a first terminal coupled to the second input ($V_{refp}$ signal) of configurable block 100 and a second terminal coupled to the first terminal of capacitor 103. Switch 119 has a first terminal coupled to the third input ($V_{refm}$ signal) of configurable block 100 and a second terminal coupled to the first terminal of capacitor 103. Switch 122 has the first terminal coupled to the negative input of amplifier 101 and the second terminal coupled to the first terminal of switch 112. Switch 124 has the first terminal coupled to the first terminal of switch 134 and the second terminal coupled to the positive output of amplifier 101. Switch 125 has the first terminal coupled to the first terminal of capacitor 106 and the second terminal coupled to the sixth input (VCM voltage) of configurable block 100. Switch 126 has the first terminal coupled to the second terminal of capacitor 106 and the second terminal coupled to the sixth input (VCM voltage) of configurable block 100.

Switch 120 has a first terminal coupled to the third input ($V_{refm}$ signal) of configurable block 100 and a second terminal coupled to the first terminal of capacitor 104. Switch 121 has a first terminal coupled to the second input ($V_{refp}$ signal) of configurable block 100 and a second terminal coupled to the first terminal of capacitor 104. Switch 123 has the first terminal coupled to the positive input of amplifier 101 and the second terminal coupled to the first terminal of switch 113. Switch 127 has the first terminal coupled to the second terminal of capacitor 105 and the second terminal coupled to the negative output of amplifier 101. Switch 128 has the first terminal coupled to the first terminal of capacitor 107 and the second terminal coupled to the sixth input (VCM voltage) of configurable block 100. Switch 129 has the first terminal coupled to the second terminal of capacitor 107 and the second terminal coupled to the sixth input (VCM voltage) of configurable block 100.

Figure 9:
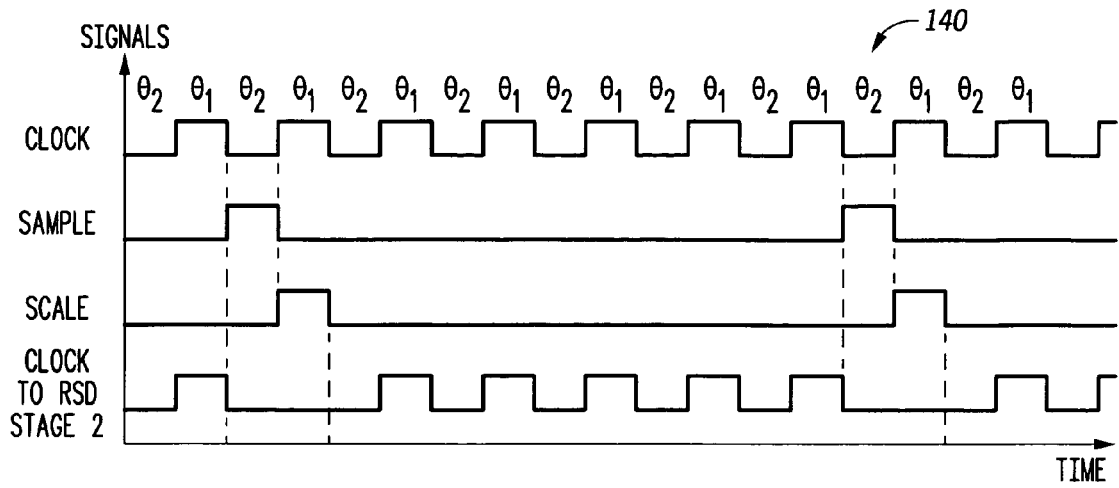
FIG. 9 is a timing diagram for illustrating an operation of the configurable block of FIG. 8.

FIG. 9 is a timing diagram 140 for illustrating an operation of configurable block 100 of FIG. 8. Timing diagram 140 simulates configurable block 100 (FIG. 7) as if it were part of two stage redundant signed digit (RSD) analog to digital converter such as that shown in FIG. 5. The clocking sequence of timing diagram 140 shows a typical conversion cycle where an analog signal is sampled followed by the generation of the logic bits that form a digital word corresponding to the sampled analog signal. The clock to RSD stage2 signal has a phase $\theta_1$ that enables switches 108–117 and disables switches 118–130 and a phase $\theta_2$ that enables switches 118–130 and disables switches 108–130 of configurable block 100 (FIG. 8).

The conversion cycle begins with the sample signal transitioning from a low logic state to a high logic state. Referring back to FIG. 8, configurable block 100 is configured as a sample/hold circuit. The sample/hold circuit is in a sample mode. The sample signal enables switches 112–117 and 131–134. Configurable block 100 samples the $V_{analog}$ signal applied to the first input of configurable block 100. In particular, capacitors 103 and 104 store a voltage that is the difference between the $V_{analog}$ signal voltage and the $V_{Ref/2}$ signal voltage. The first and second terminals of capacitors 102 and 105 are coupled to the VCM voltage thus storing no voltage. Amplifier 101 is placed in a configuration where capacitor 106 is coupled between the negative input and the positive output of amplifier 101. Also, capacitor 107 is coupled between the positive input and negative output of amplifier 101.

Referring back to FIG. 9, the sample signal transitions from the high logic state to a low logic state removing configurable block 100 from the sample mode. The scale signal transitions from a low logic state to a high logic state. Referring back to FIG. 8, the scale signal enables switches 122–129. Configurable block 100 is still the sample/hold circuit but is in a scale mode. Capacitors 106 and 107 are decoupled from amplifier 101. The first and second terminals of capacitors 106 and 107 are coupled to the VCM voltage thus storing no voltage. Capacitor 102 is coupled between the negative input and the positive output of amplifier 101. Capacitor 105 is coupled between the positive input and the negative output of amplifier 101. Capacitors 102 and 105 have no voltage stored on them. Capacitor 103 and capacitor 104 are coupled in series. Capacitor 103 is coupled to the negative input of amplifier 101. Capacitor 104 is coupled to the positive input of amplifier 101. Amplifier 101 and capacitors 102–105 are in a configuration where the sampled $V_{analog}$ signal is scaled and converted to a differential signal provided at the differential output of configurable block 100. The differential signal generated while configurable block 100 is converted to the sample/hold circuit would be provided to a first RSD stage (not shown) for determining a first logic value using the example of configurable block 100 being part of the two stage RSD cyclical analog to digital converter.

Referring back to FIG. 9, the clock signal to a second RSD stage (not shown) is in a low logic state while configurable block 100 is configured as the sample/hold circuit. The scale signal transitions from the high logic state to a low logic state. The clock signal to the second RSD stage begins clocking, beginning with phase $\theta_1$ followed by phase $\theta_2$ and repeating thereafter. The phase $\theta_1$ is a low logic state. Referring back to FIG. 8, configurable block 100 is configured as a 1.5 bit multiplying analog to digital converter (MDAC). The clock signal to the second RSD stage in phase $\theta_1$ enables switches 108–117. Configurable block 100 implemented as a major part of the second RSD stage of the RSD cyclical to analog converter has time for the change from the sample/hold circuit to the second RSD stage (1.5 bit MDAC). The second RSD stage would first receive a residue from the first RSD stage from which a logic bit value would be determined by the second RSD stage during phase $\theta_1$ of the clock signal to the second RSD stage.

The second RSD stage generates a bit value upon receiving a residue voltage from the first RSD stage (not shown). The residue voltage (which is a differential voltage) is provided to the fourth ($V_{inp}$ signal) and fifth ($V_{inm}$ signal) inputs of configurable block 100 during phase $\theta_1$. A difference voltage corresponding to the difference between the $V_{inp}$ signal and the VCM voltage is stored on both capacitors 102 and 103. A difference voltage corresponding to the difference between the $V_{inm}$ signal and the VCM voltage is stored on both capacitors 104 and 105. Optionally, configurable block 100 can be modified to add circuitry to cancel the offset voltage of amplifier 101.

Configurable block 100 remains as the 1.5 bit MDAC as the clock signal to the second RSD stage transitions from phase $\theta_1$ to phase $\theta_2$. Digital logic (not shown) of the second RSD stage generates the $V_{refp}$ and $V_{refm}$ signals coupled respectively to the second and third inputs of configurable block 100. A voltage $V_{refp}$, 0, or $V_{refm}$ is provided to configurable block 100 that corresponds to the magnitude of the residue provided by the first RSD stage which aids in the calculation of the residue from the 1.5 bit MDAC. Capacitors 106 and 107 are decoupled from amplifier 101. The first and second terminals of capacitor 106 and 107 are coupled to the voltage VCM thus storing no voltage. Capacitor 103 is coupled to receive a voltage $V_{refp}$, 0, or $V_{refm}$. Similarly, capacitor 104 is coupled to receive a voltage $V_{refp}$, 0, or $V_{refm}$. Capacitor 102 is coupled between the negative input and positive output of amplifier 101. Capacitor 105 is coupled between the positive input and the negative output of amplifier 101. Block 100 as the 1.5 bit MDAC is placed in a state that is ready to calculate a residue.

Referring back to FIG. 9, the clock to the second RSD stage repeatedly transitions from a phase $\theta_1$ to a phase $\theta_2$. In each phase $\theta_1$ bit value is calculated by the second RSD stage and in phase $\theta_2$, configurable block 100 as the 1.5 bit multiplying analog to digital converter (MDAC) generates a residue that is provided back to the first RSD stage. The conversion cycles back and forth between the first and second RSD stages calculating a bit value each half clock cycle. The number of clock cycles of clock to the second RSD stage determines the resolution of the digital word generated corresponding to the sampled input analog voltage. A next sample/conversion cycle begins when the sample signal transitions from the low logic state to a high logic state and the clock signal to the second RSD stage is forced to a low logic state.

Figure 10:
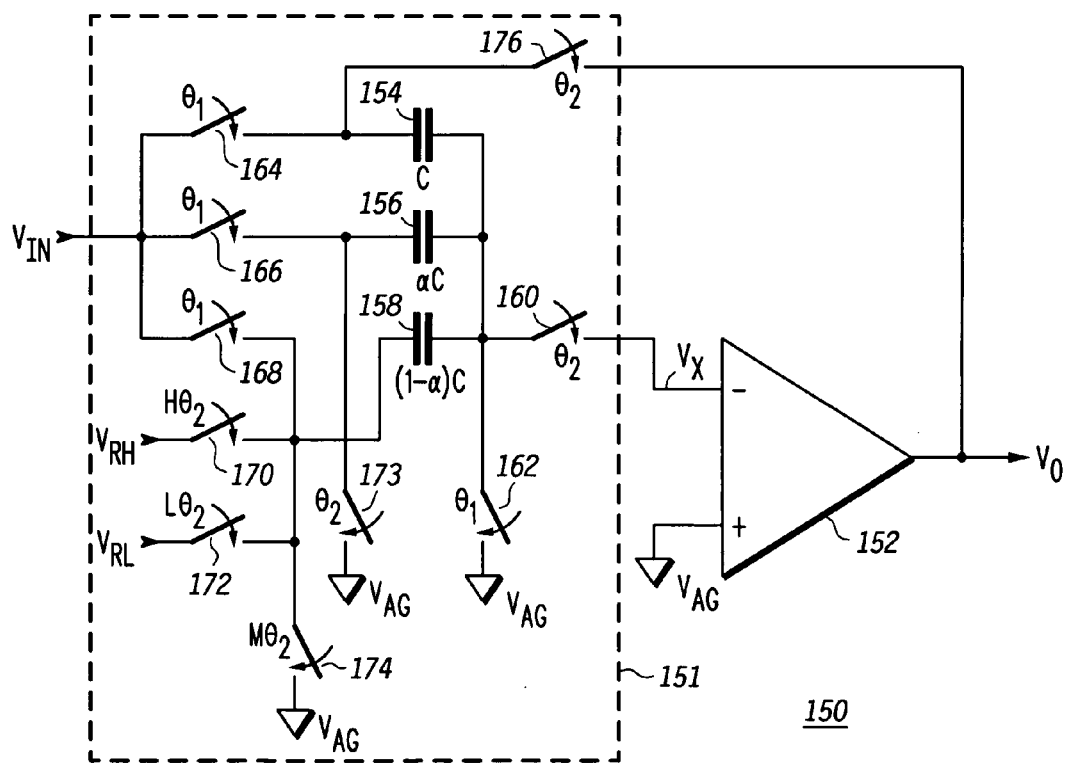
FIG. 10 is a partial schematic of one form of a circuit for use in an RSD data converter that directly uses an external reference voltage.

Illustrated in FIG. 10 is a circuit 150 for RSD data converters that have optimized reference voltage generation. In the illustrated form an operational amplifier 152 is used with capacitors 154, 156 and 158 to scale an analog input voltage by a desired amount to provide an output voltage, $V_O$. A switch 160 has a first terminal connected to an inverting or negative input of operational amplifier 152. A second terminal of switch 160 is connected to a first electrode of each of capacitors 154, 156 and 158 and to a first terminal of a switch 162 at a common node. A second terminal of switch 162 is connected to an analog ground terminal labeled $V_{AG}$. A positive or non-inverting input of operational amplifier 152 is connected to $V_{AG}$. A second electrode of capacitor 154 is connected to a first terminal of a switch 164. A second terminal of switch 164 is connected to an input for receiving the analog input voltage, $V_{IN}$. A first terminal of a switch 173 is connected to a second electrode of capacitor 156. Switch 173 has a second terminal connected to an analog ground terminal labeled $V_{AG}$. A first terminal of a switch 166 is connected to the second electrode of capacitor 156. A second terminal of switch 166 is connected to the input that receives the analog input voltage. A first terminal of a switch 168 is connected to the input that receives the analog input voltage, $V_{IN}$. A second terminal of switch 168 is connected to a first terminal of a switch 170, to a first terminal of a switch 172 and to a second electrode of capacitor 158. A second terminal of switch 170 is connected to an input for receiving a high reference voltage labeled $V_{RH}$ supplied by a user. A second terminal of switch 172 is connected to an input for receiving a low reference voltage labeled $V_{RL}$ supplied by a user. A switch 174 has a first terminal connected to the second electrode of capacitor 158, to the second terminal of switch 168, to the first terminal of switch 170 and to the first terminal of switch 172. A second terminal of switch 174 is connected to analog ground, $V_{AG}$. A switch 176 has a first terminal connected to the second electrode of capacitor 154 and a second terminal connected to an output of operational amplifier 152 for providing the voltage $V_O$. The switches 162, 164, 166 and 168 are clocked by a control signal labeled θ1 which is a first phase of an oscillating clock signal. The switches 173, 160 and 176 are clocked by a control signal labeled θ2 that is a second phase of the oscillating clock signal that does not overlap with the first phase. The switch 170 is clocked by a control signal labeled Hθ2 that is selectively asserted during the second phase of the oscillating clock signal. In the context of an RSD stage, such as the RSD stage 40 of FIG. 3, of an RSD cyclical analog to digital converter, such as the converter 10 of FIG. 1, switch 170 is made conductive when a subtraction of a scaled $+V_{ref}$ from the $2V_{IN}$ result of amplification stage 49 is needed as a result of the input signal being higher than the high switch point, $V_h$. The switch 172 is clocked by a control signal labeled Lθ2 that is selectively asserted during the second phase of the oscillating clock signal. In the context of the RSD stage of an RSD converter such as the converter of FIG. 3, switch 172 is made conductive when an addition of a scaled+$V_{ref}$ from the $2V_{IN}$ result of amplification stage 49 is needed as a result of the input signal being lower than the low switch point, $V_L$. The switch 174 is clocked by a control signal labeled Mθ2 that is selectively asserted during the second phase of the oscillating clock signal. In the context of the RSD stage of an RSD converter such as the converter of FIG. 3, switch 174 is made conductive when no addition or subtraction of a reference voltage to the $2V_{IN}$ result of amplification stage 49 is needed as a result of the input signal being between the high switch point $V_h$ and the low switch point $V_L$. Only one of switch 168, 170 and 174 is conductive during the second clock phase of the oscillating clock signal. Capacitors 154, 156 and 158 and switches 160, 162, 164, 166, 168, 170, 172 and 176 form a switched capacitor network 151. Switches 160, 162, 164, 166, 168, 170, 172 and 176 may be implemented as transistor switches, including for example, CMOS transmission gates that are complementary conductivity parallel transistors that are controlled by complementary clock signals.

In operation, circuit 150 functions as a double gain amplification circuit that scales a reference voltage $V_{RH}$ and adds or subtracts a scaled $V_{RH}$. The $V_{RH}$ and the $V_{RL}$ are reference voltages supplied by a user that can be beyond the specified operational range of the circuit 150. It is possible that $V_{RH}$ may be greater than the operating voltage of the circuit 150 and that $V_{RL}$ may be below ground potential and therefore less than the operating voltage of the circuit 150. Other exemplary values of $V_{RH}$ and $V_{RL}$ are $V_{DD}$ and ground, respectively. A scaled version of an analog input signal $V_{IN}$ is received at the first terminals of switches 164, 166 and 168. The input signal has been scaled by circuitry (not shown) such as the sample and hold circuit of FIG. 2.

The scaling was to a voltage that complies with the operating specifications of operational amplifier 152. Assume that in the first clock phase that all switches that are controlled by θ1 are closed or conductive, and that all switches that are controlled by θ2 are open or nonconductive. The purpose of circuit 150 is to receive the scaled $V_{IN}$ signal, multiply the scaled $V_{IN}$ signal by two and either add a scaled $V_{RH}$, subtract a scaled $V_{RH}$ or pass the input signal that has been doubled without additional modification.

For purposes of explanation, assume that the input signal has been scaled by fifty percent so that it fits within the operational range of the operational amplifier 152. Assume that $V_{RH}$ is the full range of the unscaled $V_{IN}$ signal and that $V_{RL}$ is ground potential. A scaling factor of 0.5 therefore exists. In other words, the a in the scaling factors for capacitors 156 and 158 is therefore 0.5. During the first phase, switches 164, 166 and 168 are conductive and the input voltage $V_{IN}$ is sampled onto each of capacitors 154, 156 and 158. Switches 170, 172, 173, 174, 160 and 176 are non-conductive. Switch 162 is conductive. During the second phase, the conductivity of these switches reverses. As a result, the input of capacitor 154 is connected to the output of operational amplifier 152 through switch 176 thus bringing the output of the amplifier to the scaled $V_{IN}$. When capacitor 154 was switched to the output through switch 176, it now acts as a feedback capacitor around the operational amplifier 152 to cancel any charge changes on capacitors 156 and 158. A voltage transfer of $V_{IN}$ occurs on capacitor 156 by the electrical shorting of capacitor 156 via switch 173 to ground. To cancel this charge transfer, the output of operational amplifier 152 must go up by α ($V_{IN}$) or 0.5 $V_{IN}$. Therefore, at the output of operational amplifier 152 there is $V_{IN}$ plus 0.5 $V_{IN}$. One of three circuit conditions may result in connection with the charge transferred onto capacitor 158. First, if there is no addition or subtraction of the scaled $V_{RH}$ to the doubling of $V_{IN}$, switch 174 is closed and switches 170 and switches 172 are left open by control circuitry (not shown). With switch 174 closed, a voltage transfer of $V_{IN}$ occurs on capacitor 158 by the electrical shorting of capacitor 158 via switch 174 to ground. To cancel this charge transfer, the output of operational amplifier 152 must goes up by (1−α) ($V_{IN}$) or 0.5$V_{IN}$. Therefore, the total resulting voltage at the output of operational amplifier 152 is 2$V_{IN}$. This is the desired result when the input voltage $V_{IN}$ is between the high switch point, $V_h$, and the low switch point, $V_L$, of the 1.5 bit quantizer 41 of FIG. 3. Second, if a subtraction of a scaled+$V_{RH}$ from the 2$V_{IN}$ is needed as a result of the input signal being higher than the high switch point, then switch 170 is made conductive and switches 172 and 174 are made nonconductive by the same control circuitry (not shown). With switch 170 closed, a charge transfer of $V_{RH}$−$V_{IN}$ is pushed onto capacitor 158. Because the input signal was scaled by a factor of two (i.e. reduced by 50 percent), the scaled $V_{RH}$ that is to be subtracted from 2$V_{IN}$ at the output of the operational amplifier 152 is one-half the size of $V_{RH}$. For purposes of explanation, assume that the scaled $V_{RH}$ is referred to as $V_{Rscaled}$. So the charge that is pushed onto capacitor 158 can be rewritten as $[V_{Rscaled}-V_{IN}]+V_{Rscaled}$. To cancel this charge transfer, the output of operational amplifier 152 must go down by α $([V_{Rscaled}-V_{IN}]+V_{Rscaled})$. This circuit configuration results in a total voltage at the output of $V_{IN}$ (contributed by capacitor 154)+0.5 $V_{IN}$ (contributed by capacitor 156)−0.5 $([V_{Rscaled}-V_{IN}]+V_{Rscaled})$ (contributed by capacitor 158 through switch 170). This value results in 2$V_{IN}$−$V_{Rscaled}$.

Third, if an addition of a scaled+$V_{RH}$ to the 2$V_{IN}$ is needed as a result of the input signal being lower than the low switch point $V_L$ of the 1.5 bit quantizer 41 of FIG. 3, then switch 172 is made conductive and switches 170 and 174 are made nonconductive by the same control circuitry (not shown). With switch 172 closed, a voltage of $V_{RL}-V_{IN}$ is pushed onto capacitor 158. This charge transfer can be rewritten as a charge of a $-V_{RH}-V_{IN}$ being pushed onto capacitor 158 by substituting a $(-V_{RH})$ for $V_{RL}$. This substitution can be made because $V_{RH}$ is the same potential above the operational midpoint as $V_{RL}$ is below the operational midpoint. Because the input signal was scaled by a factor of two (i.e. reduced by 50 percent), the scaled $V_{RH}$ that is to be added to $2V_{IN}$ at the output of the operational amplifier 152 is one-half the size of $V_{RH}$. For purposes of explanation, assume that the scaled $V_{RH}$ is referred to as $V_{Rscaled}$. So the voltage that is pushed onto capacitor 158 can be rewritten as $[-V_{Rscaled}-V_{IN}]-V_{Rscaled}$. To cancel this charge transfer, the output of operational amplifier 152 must go up by $-(1-\alpha)$ $([-V_{Rscaled}-V_{IN}]-V_{Rscaled})$. This results in a total voltage at the output of $V_{IN}$ (contributed by capacitor 154)+0.5 $V_{IN}$ (contributed by capacitor 156)$-0.5([V_{Rscaled}-V_{IN}]-V_{Rscaled})$ (contributed by capacitor 158 through switch 172). This value results in $2V_{IN}+V_{Rscaled}$.

Therefore, circuit 150 functions to double the gain of a received analog input signal and add or subtract a scaled $V_{RH}$ to the amplified signal where the scaling is by a factor of one or less. One use of such an output signal is in an RSD stage of an A/D converter. However, scaled reference voltages of $V_{RH}$ and $V_{RL}$ that typically are required to be separately generated with additional, power-consuming circuitry did not have to be generated for use with circuit 150.

To better understand the operation of circuit 150 described above, a review of charge transfer equations associated with charge transfer within circuit 150 will be provided. During even (e) clock phases, i.e. phases 0, 2, 4, etc. the change in charge of each of capacitors 154, 156 and 158 may be represented as:

$$\Delta Q_{c\ 154}=C((V_o^e-V_x^e)-(V_i^0-0)z^{-1/2})$$
$$=CV_o^e-CV_x^e-CV_i^0z^{-1/2}$$

$$\Delta Q_{c\ 156}=\alpha C((0-V_x^e)-(V_i^0-0)z^{-1/2})$$
$$=\alpha CV_x^e-\alpha CV_i^0z^{-1/2}$$

$$\Delta Q_{c\ 158}=(1-\alpha)C((V_{RH}-V_x^e)-(V_i^0-0)z^{-1/2})=(1-\alpha)CV_{RH}-(1-\alpha)CV_x^e-(1-\alpha)CV_i^0z^{-1/2}$$

By the law of charge conservation:

$$\Delta Q_{c\ 154}+\Delta Q_{c\ 156}+\Delta Q_{c\ 156}=0$$

$$V_o^e=(V_i^0(C+\alpha C+(1-\alpha)C)z^{-1/2})/C+(V_{RH}(1-\alpha)C)/C+V_x^e(C+\alpha C+(1-\alpha)C)/C$$

Therefore, $$V_o^e=V_i^0(1+\alpha+1-\alpha)z^{-1/2}-V_{RH}(1-\alpha)+V_x^e(1+\alpha+(1-\alpha))$$

$$V_o^e=2V_i^0z^{-1/2}-V_{RH}(1-\alpha)+2V_x^e$$

If operational amplifier 152 is ideal, then the term $V_x^e$ is zero. The term $(1-\alpha)$ can be set arbitrarily so that any scaling factor from zero to one can be achieved. When switch 172 is active and $V_{RL}$ is pushed on capacitor 158, the term $V_{RH}$ $(1-\alpha)$ becomes positive and can be added to twice the input voltage. The reference voltage $V_{RL}$ may be substituted for $-V_{RH}$ depending upon the specific MDAC operation. The term $z^{-1/2}$ represents a frequency domain term and indicates that the charge values represented by the equations are expressed as charge values from one-half of the immediately prior phase with respect to time. The term $V_x$ represents the voltage at the negative input of operational amplifier 152. The superscript "o" indicates the voltage during an odd clock phase whereas the superscript "e" indicates the voltage during an even clock phase.

It should be understood that other implementations of the feedback configuration of operational amplifier 152 may be used than the one disclosed in FIG. 10. For example, a conventional auto-zeroing feedback circuit may be used between the negative input of operational amplifier 152 and the output thereof to remove offset error voltage from the negative input.

Figure 11:
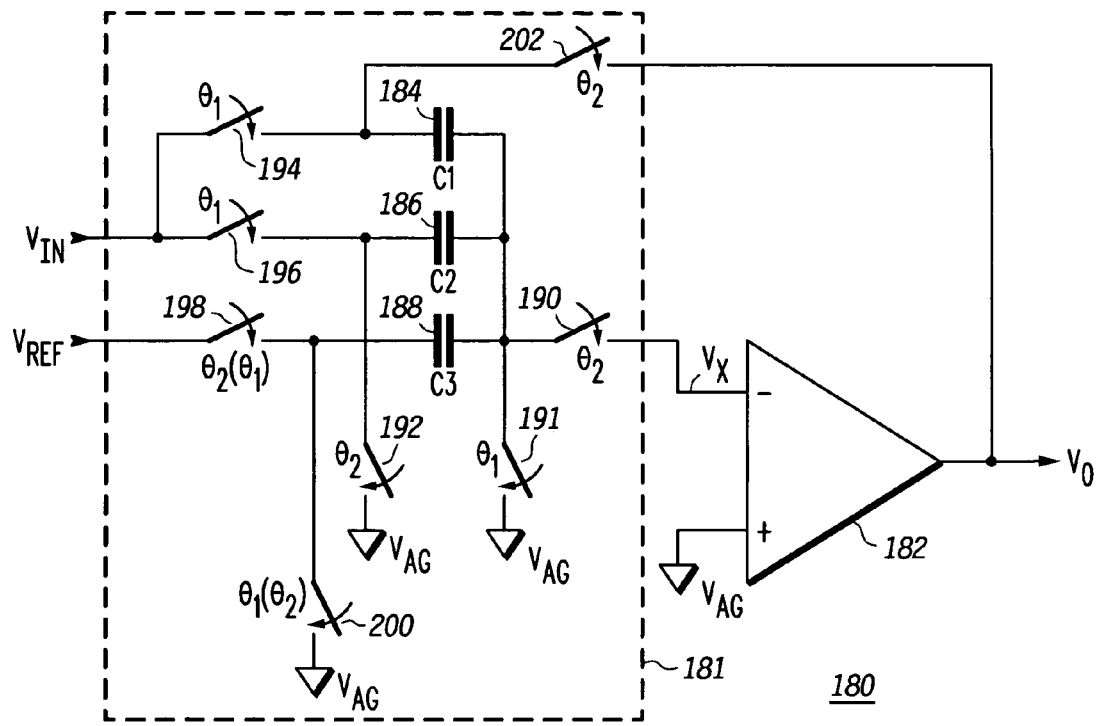
FIG. 11 is a partial schematic of another form of a circuit for use in an RSD data converter that directly uses an external reference voltage.

Illustrated in FIG. 11 is a circuit 180 that functions to double the gain of a received analog input signal and add or subtract a scaled $V_{RH}$ to the amplified signal where the scaling is by any factor including scaling factors greater than one. An operational amplifier 182 has an inverting or negative input, a positive or non-inverting input and an output for providing an output signal $V_O$. A switch 190 has a first terminal connected to the negative input of operational amplifier 182 where a voltage $V_x$ is present. A second terminal of switch 190 is connected to a first electrode of each of capacitors 184, 186 and 188 and to a first terminal of a switch 191. A second terminal of switch 191 is connected to an analog ground reference terminal, $V_{AG}$. A first terminal of a switch 192 is connected to a second electrode of capacitor 186. A second terminal of switch 192 is connected to an analog ground terminal. A first terminal of a switch 194 is connected to a second electrode of capacitor 184. A second terminal of switch 194 is connected to an input terminal for receiving an analog input voltage $V_{IN}$. A first terminal of a switch 196 is connected to a second electrode of capacitor 186. A second terminal of switch 196 is connected to the input terminal for receiving $V_{IN}$. A first terminal of a switch 198 is connected to a second electrode of capacitor 188. A second terminal of switch 198 is connected to a reference voltage, $V_{REF}$, supplied by a user of circuit 180. A first terminal of a switch 200 is connected to the first terminal of switch 198 and the second electrode of capacitor 188. A second terminal of switch 200 is connected to an analog ground reference voltage. A first terminal of a switch 202 is connected to the electrode of capacitor 184 and the first terminal of switch 194. A second terminal of switch 202 is connected to the output of operational amplifier 182. In the illustrated form, switches 191, 194, 196 and 200 are made conductive during a first phase of a clock signal period and switches 190, 192 and 202 are made conductive during a second phase of the clock signal period. In the illustrated form, the clock signal is a logic high during the first phase and is a logic low during the second phase, but it should be apparent that the reverse order may also be implemented. Switches 198 and 200 may be implemented to be conductive during one of the two clock phases, but are oppositely conductive from each other. Thus in FIG. 11, both clock phases are illustrated next to each of switches 198 and 200, but in opposite order. Capacitors 184, 186 and 188 and switches 190, 191, 192, 194, 196, 198, 200 and 202 form a switched capacitor network 181. Switches 190, 191, 192, 194, 196, 198, 200 and 202 may be implemented as transistor switches, including for example, CMOS transmission gates that are complementary conductivity parallel transistors that are controlled by complementary clock signals.

In operation, circuit 180 also functions as a double gain amplification circuit that adds or subtracts a scaled $V_{RH}$. The $V_{RH}$ and the $V_{RL}$ are reference voltages supplied by a user that can be less than the scaled input signal and therefore needs to be scaled up to the same level as the scaled $V_{IN}$. A scaled version of an analog input signal $V_{IN}$ is received at the first terminals of switches 194 and 196. The input signal has been scaled by circuitry (not shown) such as the sample and hold circuit of FIG. 2. The scaling was to a voltage that complies with the operating specifications of operational amplifier 182. Assume that in the first clock phase, all switches controlled by θ1 are closed or conductive, and that all switches controlled by θ2 are open or nonconductive. The purpose of circuit 180 is to receive the scaled $V_{IN}$ signal, multiply the scaled $V_{IN}$ signal by two and either add a scaled $V_{RH}$, subtract a scaled $V_{RH}$ or pass the input signal that has been doubled without additional modification.

For purposes of explanation, assume the amplitude of the scaled $V_{IN}$ is within the operational range of operational amplifier 182. Assume also that $V_{RH}$ is only half the maximum amplitude of this input signal and therefore needs to be scaled up by a factor of 2. In order to achieve this scaling factor, capacitor 188 needs to be twice as large as either capacitor 184 or 186. During the first clock phase, switches 194 and 196 are conductive and the input voltage $V_{IN}$ is sampled onto capacitors 184 and 186. Switches 190, 192 and 202 are non-conductive. Switch 191 is conductive. During the second clock phase the conductivity of these switches is reversed. As a result, the input of capacitor 184 is connected to the output of the operational amplifier 182 through switch 202 thus bringing the output of the amplifier to $V_{IN}$. When capacitor 184 is switched to the output through switch 202, capacitor 184 functions as a feedback capacitor around the operational amplifier 182 to cancel any charge changes on capacitors 186 and 188. A voltage transfer of $V_{IN}$ occurs on capacitor 186 by the electrical short-circuiting of capacitor 186 via switch 192 to ground. To cancel this charge transfer, the output of operational amplifier 182 must go up by $V_{IN}$, because the feedback capacitor 184 is the same size as capacitor 186. Therefore, at the output of the operational amplifier 182, there is an output voltage of $(V_{IN}+V_{IN})$ or $2V_{IN}$. One of three circuit conditions may result in connection with the charge transfer onto capacitor 188. For purposes of clarity the scaled $V_{RH}$ voltage will be referred to as $V_{Rscaled}$. First, if there is no addition or subtraction of $V_{Rscaled}$ to the doubling of $V_{IN}$, switch 198 and switch 200 are not active during phase 1 or phase 2. This switching configuration results in no additional charge contribution from capacitor 188, thus leaving the output at $2(V_{IN})$. This output voltage is the desired result when the input voltage $V_{IN}$ is between the high switch point, $V_H$, and the low switch point, $V_L$, of the 1.5 bit quantizer 41 of FIG. 3. Second, if a subtraction of a $V_{Rscaled}$ from the $2V_{IN}$ is needed as a result of the input signal being higher than the high switch point $V_H$, then switch 200 is active during phase 1 and switch 198 is active during phase 2. This switching configuration results in a voltage of $V_{RH}$ being pushed onto capacitor 188 during phase 2. To cancel this charge transfer, the output of the operational amplifier 182 must go down by a factor of two because capacitor 188 is twice as big as the feedback capacitor 184. This circuit configuration results in a total voltage at the output of operational amplifier 182 of $V_{IN}$ (contributed by capacitor 184)+$V_{IN}$ (contributed by capacitor 186)−$2V_{RH}$ (contributed by capacitor 188). Because $V_{RH}$ is one-half the size of $V_{Rscaled}$, the value results in $2V_{IN}-V_{Rscaled}$, which is the desired result.

Third, if an addition of a scaled reference voltage, $V_{Rscaled}$, to the $2(V_{IN})$ signal is needed as a result of the input signal being lower than the low switch point, $V_L$, of the 1.5 bit quantizer 41 of FIG. 3, then switch 198 is conductive and switch 200 is not conductive during phase 1 while conversely switch 200 is conductive and switch 198 is not conductive during phase 2. This switching configuration results in a voltage of $V_{RH}$ being pulled from capacitor 188 during phase 2. To replace this charge transfer, the output of the operational amplifier 182 must go up by a factor of two because capacitor 188 has a capacitive value that is twice as big as the capacitive value of feedback capacitor 184. This circuit configuration results in a total voltage at the output of operational amplifier 182 of $V_{IN}$ (contributed by capacitor 184)+$V_{IN}$ (contributed by capacitor 186)+$2V_{RH}$ (contributed by capacitor 188). Because $V_{RH}$ is one-half the voltage magnitude of $V_{Rscaled}$, the output is $2V_{IN}+V_{Rscaled}$, which is the desired result. Therefore, it has been demonstrated that circuit 180 functions to scale the received reference voltage $V_{REF}$ by scaling factors from any value ranging from zero and above, including greater than one.

To better understand the operation of circuit 180 described above, a review of charge transfer equations associated with charge transfer within circuit 180 will be provided. During even (e) clock phases, i.e. phases 0, 2, 4, etc. with switch 198 conductive and switch 200 nonconductive, the change in charge of each of capacitors 184 (capacitor C1), 186 (capacitor C2) and 188 (capacitor C3) may be represented as:

$$\Delta Q_{c1} = C_1 V_0^e - C_1 V_x^e - C_1 V_i^0 z^{-1/2}$$

$$\Delta Q_{c2} = C_2 V_x^e - C_2 V_i^0 z^{-1/2}$$

$$\Delta Q_{c3} = C_3((V_{RH} - V_x^e) - 0) = C_3 V_{RH} - C_3 V_x^e$$

or during odd clock phases, i.e. phases 1, 3, 5, etc. with switch 200 conductive and switch 198 nonconductive, the change in the charge of capacitor C3 (capacitor 188) may be represented as:

$$\Delta Q_{c3} = C_3((0 - V_x^e) - (V_{RH} - 0)) = -C_3 V_{RH} - C_3 V_x^e.$$

By the law of charge conservation:

$$\Delta Q_{c1} + \Delta Q_{c2} + \Delta Q_{c3} = 0$$

$$V_0^e = V_i^0 z^{-1/2}((C_1+C_2)/C_1) + (-)(C_3/C_1)V_{RH} + V_x^e \\ ((C_1+C_2+C_3)/C_1)$$

Therefore, $$V_0^e = V_i^0 z^{-1/2}((1+C_2/C_1) + (-) \quad (C_3/C_1)V_{RH} + V_x^e(1+C_2/C_1+C_3/C_1)$$

If operational amplifier 182 is ideal, then $V_x^e$ is equal to zero.

$$V_0^e = V_i^0 z^{-1/2}(1+C_2/C_1) + (-)(C_3/C_1)V_{RH}$$

From the equation above, it is clear that the second term which is added or subtracted from the first term may be set independently of the values of $C_1$ and $C_2$.

Figure 12:
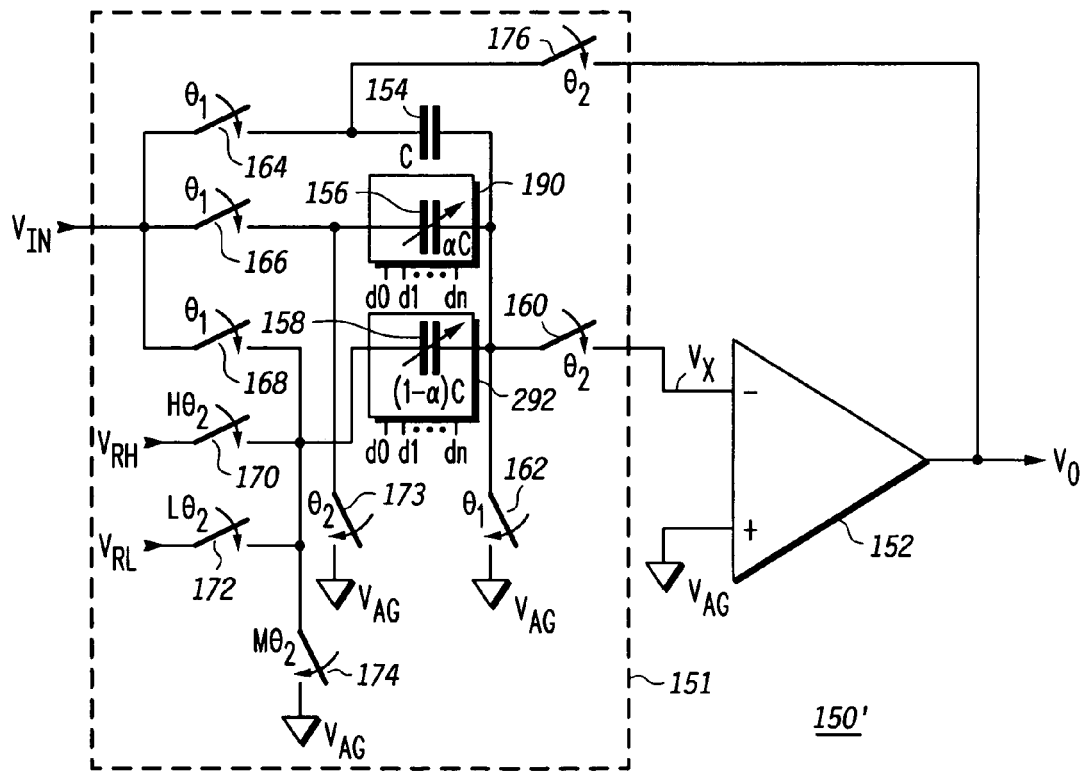
FIG. 12 is a partial schematic of the circuit of FIG. 10 having a user programmable scaling factor.

Illustrated in FIG. 12 is a circuit 150' that has a switched capacitor network that is user-programmable for permitting a user to program the scaling factor of the reference voltage to be one of a predetermined number of possible scaling factors. For convenience of illustration, elements that are common between circuit 150' and circuit 150 of FIG. 10 are identically numbered. Capacitor 156 is made variable in capacitive value by a control circuit 290 and capacitor 158 is made variable in capacitive value by a control circuit 292. Control circuit 290 has a multiple number of control inputs, either digital bits or signals, labeled "d0", "d1" . . . . "dn". The capacitive value of capacitor 156 depends upon which of the "dn" bits or signals are asserted. Therefore, the capacitive value of capacitor 156 can vary between any of $2^n$ values from a minimum capacitive value to a maximum to implement in combination with capacitors 154 and 158 a desired scaling factor for the high reference voltage or the low reference voltage. Various methods of user control can be used. For example, one or more integrated circuit pins may be used, processor instruction execution control may be used, or stored control values in a memory or other storage device may be used.

Figure 13:
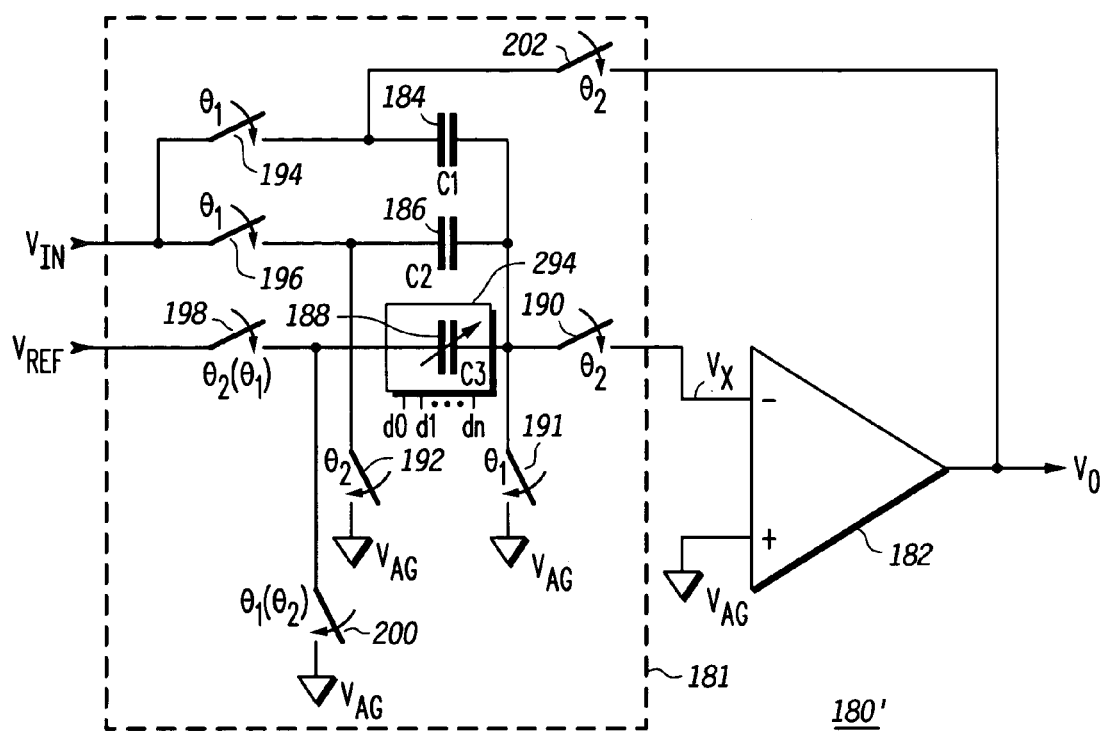
FIG. 13 is a partial schematic of the circuit of FIG. 11 having a user programmable scaling factor.

Illustrated in FIG. 13 is a circuit 180' that has a switched capacitor network that is also user-programmable for permitting a user to program the scaling factor of the reference voltage to be one of a predetermined number of possible scaling factors. For convenience of illustration, elements that are common between circuit 180' and circuit 180 of FIG. 11 are identically numbered. Capacitor 188 is made variable in capacitive value by a control circuit 294. Control circuit 294 has a multiple number of control inputs, either digital bits or signals, labeled "d0", "d1" . . . . "dn". The capacitive value of capacitor 188 depends upon which of the "dn" bits or signals are asserted. Therefore, the capacitive value of capacitor 188 can vary between any of $2^n$ values from a minimum capacitive value to a maximum to implement in combination with capacitors 184 and 188 a desired scaling factor for the high reference voltage or the low reference voltage. As with circuit 150', various methods of user control can be used. For example, one or more integrated circuit pins may be used, processor instruction execution control may be used, or stored control values in a memory or other storage device may be used. It should be noted that the capacitive values of capacitors 154, 156, 158, 184, 186 and 188 required to implement the functions described herein may be sufficiently small enough to be integrated onto an integrated circuit without consuming a large amount of die area. The ratios of the capacitive values, in addition to the capacitive values, determine the desired scaling.

By now it should be apparent that there has been provided methods and circuits for optimizing reference voltage generation for cyclic and pipelined A/D converter architectures. By eliminating a need to use a reference voltage scaling circuit to provide a reference voltage for a cyclic A/D converter, a number of advantages are achieved. For example, resistor dividers are commonly used to scale reference voltages used for data converters. Such resistors are a source of error as the values of the resistors varies significantly with respect to processing and temperature. These errors result in gain and offset error within an A/D converter. Eliminating such resistor divider circuitry also provides a significant savings in integrated circuit size and in power consumption. Also, elimination of additional integrated circuit pins may occur in some designs where large valued capacitors were required to be implemented external to the integrated circuit to implement the desired scaling. Therefore, there has been provided a compact circuit solution for amplifying an analog input signal by a desired amount while adding a scaled reference voltage derived from a received full-scale reference voltage. Since the scaling factor is adjustable by a user or a programmer of the circuit, the circuitry is readily adaptable for a variety of circuit applications, such as for example in an RSD section of a cyclic A/D converter. Additionally, gain error and offset error of the A/D converter is significantly reduced by using a switched capacitor network and operational amplifier as described herein.

In one form there has been provided an analog-to-digital converter (ADC). An amplifier has an input and an output. A switched capacitor network is coupled to the input of the amplifier and is coupled to receive an analog input signal and a plurality of reference input signals input to the ADC. The switched capacitor network has a plurality of capacitors and switches, each of the plurality of capacitors being coupled to receive at least one of the analog input signal or the reference input signals. The amplifier and switched capacitor network are configured to scale at least one of the plurality of reference input signals by a predetermined scale factor, the predetermined scale factor being determined at least in part by capacitance values of the switched capacitor network. The amplifier and switched capacitor network is further configured to provide an output signal comprising a predetermined gain of the analog input signal adjusted by the predetermined scale factor of the at least one of the plurality of reference input signals. The plurality of reference input signals includes a first reference input signal and a second reference input signal. The switched capacitor network has a first capacitor controllably coupled to receive the analog input signal. A second capacitor is controllably coupled to alternately receive the analog input signal or the first reference input signal. A third capacitor is controllably coupled to receive at least one signal of the analog input signal or the second reference input signal. Capacitance of the first capacitor is designed to be substantially equal to a sum of designed capacitances of the second and third capacitors. The designed capacitances of the second and third capacitors are substantially equal. The designed capacitances of the second and third capacitors are substantially equal. The third capacitor is further controllably coupled to the first reference input signal and a third reference input signal. The third capacitor is coupled to the analog input signal during a first clock phase and is coupled to the second reference input signal during a second clock phase when the analog input signal is within a first signal range. The third capacitor is coupled to the first reference input signal during a second clock phase when the analog input signal is within a second signal range, and the third capacitor is coupled to the third reference input signal during the second clock phase when the analog input signal is within a third signal range. The first capacitor is coupled to the analog input signal during the first clock phase. The second capacitor is coupled to the analog input signal during the first clock phase and to the first reference input signal during the second clock phase. The first signal range includes voltage potentials higher than voltage potentials of the second signal range and the third signal range, and the third signal range includes voltage potentials lower than voltage potentials of the first signal range and the second signal range. The predetermined gain is negative when the analog input signal is in the first signal range, and the predetermined gain is positive when the analog input signal is in the third signal range. The third reference input signal has a higher potential than potentials of the first and second reference input signals. The first capacitor is controllably coupled to receive a feedback signal from the output of the amplifier. At least one of the first reference input signal or the second reference input signal is a power supply signal. In one form, the first reference input signal and the second reference input signal are both ground signals. The third capacitor is further controllably coupled to the first reference input signal but not connected to the analog input signal. In another form the first capacitor is coupled to the analog input signal during a first clock phase and the second capacitor is coupled to the analog input signal during the first clock phase. The second capacitor is coupled to the first reference input signal during a second clock phase. The third capacitor is coupled to the first reference input signal during a first selected one of the first clock phase or the second clock phase, and the third capacitor is coupled to the second reference input signal during a second selected one of the first clock phase or the second clock phase. The first capacitor is coupled to a feedback signal from the output of the amplifier during a second clock phase. In one form there is further included first and second switches, wherein the third capacitor is controllably coupled to the first reference input signal or the second reference input signal depending on conductive states of the respective first and second switches. A control circuit selects a first set of states of the first and second switches during a first clock phase and alternately selects a second set of states of the first and second switches during the first clock phase. Within an integrated circuit, the predetermined scale factor is selectable after power is provided to the integrated circuit, the predetermined scale factor being selectable from a range of scale factors including a scale factor of one. There is also provided at least one RSD stage, each of the at least one RSD stage having a respective amplifier and a switched capacitor network. In another form there is a plurality of ADC stages coupled in series, each of the plurality of ADC stages including a respective amplifier and a switched capacitor network. In one form the ADC is a cyclic analog-to-digital converter (ADC) and wherein each ADC stage is a redundant signed digit (RSD) stage. A plurality of multiplying digital to analog converters (MDACs) is provided in another form, each of the plurality of ADC stages including a respective one of the plurality of MDACs, each of the plurality of MDACs including a respective amplifier and switched capacitor network. In another form there is implemented a multiplying digital to analog converter (MDAC), the MDAC including the amplifier and the switched capacitor network.

In another form there is provided a processing and scaling circuit. An amplifier has an input and an output, the amplifier having operational range within a power supply range. A switched capacitor circuit is coupled to the input of the amplifier and the output of the amplifier. The switched capacitor circuit has an analog signal input node for receiving an analog signal. A reference input node receives a reference signal capable of having a value outside the operational range of the amplifier. A plurality of capacitance elements is provided, each of the plurality of capacitance elements being controllably coupled to at least one of the analog signal input node or the reference input node and being controllably coupled to the input of the amplifier. The amplifier and switched capacitor circuit is responsive to receiving the analog signal and the reference signal and scales the reference signal by a predetermined scale factor to provide a scaled reference signal within the operational range of the amplifier. The analog signal is processed to provide an output signal having a predetermined gain of the analog signal adjusted by the predetermined scale factor of the reference signal. The switched capacitor circuit further includes first, second and third capacitors, each having first and second terminals. A first switch is coupled between the first terminal of the first capacitor and the analog signal. A second switch is coupled between the first terminal of the second capacitor and the analog signal input node. A third switch is coupled between the first terminal of the second capacitor and a first power supply signal terminal. A fourth switch is coupled between the first terminal of the third capacitor and the reference input node. The first and second capacitors are coupled to receive the analog signal and the third capacitor is not coupled to receive the analog signal. A fifth switch is coupled between the input of the amplifier and at least one of the second terminals of the first, second and third capacitors. A sixth switch is coupled between the first power supply signal terminal and at least one of the first terminals of the first, second and third capacitors. The first, second and sixth switches are controlled to close the first, second and sixth switches during a first clock phase. The third and fifth switches are controlled to close the third and fifth switches during a second clock phase. A seventh switch is coupled between the first terminal of the third capacitor and the first power supply signal terminal. The seventh switch is controlled to close the seventh switch during a first selected one of the first clock phase and the second clock phase. The fourth switch is controlled to close the fourth switch during a second selected one of the first clock phase and the second clock phase. The switched capacitor circuit further includes first, second and third capacitors, each having first and second terminals. A first switch is coupled between the first terminal of the first capacitor and the analog signal. A second switch is coupled between the first terminal of the second capacitor and the analog signal input node. A third switch is coupled between the first terminal of the third capacitor and the analog signal input node. A fourth switch is coupled between the first terminal of the second capacitor and the first power supply signal terminal. A fifth switch is coupled between the first terminal of the third capacitor and the reference input node. A sixth switch is coupled between the input of the amplifier and at least one of the first terminals of the first, second and third capacitors. A seventh switch is coupled between the first power supply signal terminal and the at least one of the first terminals of the first, second and third capacitors. The sixth and fourth switches are controlled to close the sixth and fourth switches during a first clock phase. The first, second, third and seventh switches are controlled to close the first, second, third and seventh switches during a second clock phase. The reference signal is a first reference signal. An eighth switch is coupled between the first terminal of the third capacitor and a second reference signal terminal. The fifth switch is controlled to close the fifth switch during the first clock phase when the analog signal is in a first range. The eighth switch is controlled to close the eighth switch during the first clock phase when the analog signal is in a second range. A second reference signal is coupled to the second reference signal terminal has a lower potential than the first reference signal. The first range includes higher voltage potentials than the second range. A ninth switch is coupled between the first terminal of the third capacitor and the first power supply signal terminal, wherein the ninth switch is controlled to close during the first clock phase when the analog signal is in a third range, the third range including potentials lower than the first range and higher than the second range. The second reference signal and the power supply signal are coupled to ground potential. The switched capacitor circuit further includes a feedback input node coupled to receive an amplifier feedback signal, and the first terminal of the first capacitor is controllably coupled to alternately receive the analog signal and the amplifier feedback signal. The predetermined scale factor is selected from a range of scale values including a scale value of one. The reference signal is one of a plurality of reference signals, the plurality of reference signals including a maximum power potential and a minimum power potential. In one form the minimum power potential is ground potential. The reference signal is one of at least three reference signals, the at least three reference signals includes a maximum reference signal, a minimum reference signal, and middle reference signal, the middle reference signal being at a potential between potentials of the maximum and minimum reference signals. The reference signal is one of a plurality of reference signals, the plurality of reference signals including first and second voltage signals configured for derivation from a bandgap voltage. There is provided in one form first and second power supply inputs, wherein the amplifier is coupled to receive first and second power supply signals, and the reference signal is one of the first and second power supply signals. In a system for analog-to-digital conversion, there is also provided a method for processing an analog signal. An analog signal is received at an analog-to-digital conversion (ADC) stage. An unscaled reference signal is received at the ADC stage. A scaled reference signal is generated from the unscaled reference signal by a switched capacitance and amplification circuit of the ADC stage. A processed signal is generated and output from the analog signal and the scaled reference signal by alternately coupling the analog signal and the unscaled reference signal to capacitors of the switched capacitance and amplification circuit. There is also provided a method of scaling a signal for use by a data converter. An input signal having a first operating range of voltages is received. A reference potential is received. The input signal and the reference potential are provided to a switched capacitor network having switched capacitors and an amplifier. The reference potential is scaled by a predetermined scale factor determined by capacitive values within the switched capacitor network to provide a scaled reference signal within a second operating range of voltages. The input signal is processed with the switched capacitor network to provide an output signal having a predetermined gain of the input signal adjusted by the scaled reference signal. The first operating range of voltages corresponds to a range between two power supply potentials and voltages of the second operating range are substantially within the first operating range. The data converter in one form includes an analog-to-digital converter (ADC) and the input signal is an analog signal. The analog signal is converted to a digital signal using the scaled reference signal. In one form a user of the data converter is able to programmably control the predetermined scale factor.

While at least one exemplary embodiment has been presented in the foregoing detailed description, it should be appreciated that a number of variations exist. For example, any type of semiconductor switching device may be used to implement the switches and various semiconductor structures may be used to implement the capacitors. The circuitry may be implemented in bipolar, MOS, GaAs and other semiconductor technologies. Various circuits may be used to implement the differential or operational amplifiers described herein. Any voltage values may be used for reference voltages, reference terminals and power supply voltages and terminals. The nonoverlapping control signals that are used to clock or control the switches may be generated for use with other circuitry or derived from other clock signals. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An analog-to-digital converter (ADC) comprising:
an amplifier comprising an input and an output; and
a switched capacitor network coupled to the input of the amplifier and being coupled to receive an analog input signal and a plurality of reference input signals input to the ADC comprising at least a first reference input signal and a second reference input signal, the switched capacitor network comprising a plurality of capacitors and switches, each of the plurality of capacitors being coupled to receive at least one of the analog input signal or one of the plurality of reference input signals, wherein the amplifier and switched capacitor network are configured to scale at least one of the plurality of reference input signals by a predetermined scale factor, the predetermined scale factor being determined at least in part by capacitance values of the switched capacitor network, the amplifier and switched capacitor network being further configured to provide an output signal comprising a predetermined gain of the analog input signal adjusted by the predetermined scale factor of the at least one of the plurality of reference input signals, the switched capacitor network comprising a first capacitor controllably coupled to receive the analog input signal, a second capacitor controllably coupled to alternately receive the analog input signal or the first reference input signal, and a third capacitor controllably coupled to alternately receive the analog input signal and the second reference input signal, the third capacitor being further controllably coupled to the first reference input signal and a third reference input signal, and wherein:
the third capacitor is coupled to the analog input signal during a first clock phase;
the third capacitor is coupled to the second reference input signal during a second clock phase when the analog input signal is within a first signal range;
the third capacitor is coupled to the first reference input signal during a second clock phase when the analog input signal is within a second signal range; and
the third capacitor is coupled to the third reference input signal during the second clock phase when the analog input signal is within a third signal range.

2. The ADC of claim 1 wherein capacitance of the first capacitor is designed to be substantially equal to a sum of designed capacitances of the second and third capacitors.

3. The ADC of claim 1 wherein designed capacitances of the second and third capacitors are substantially equal.

4. The ADC of claim 1 wherein the designed capacitances of the second and third capacitors are substantially equal.

5. The ADC of claim 1 wherein:
the first capacitor is coupled to the analog input signal during the first clock phase; and
the second capacitor is coupled to the analog input signal during the first clock phase and to the first reference input signal during the second clock phase.

6. The ADC of claim 1 wherein the first signal range includes voltage potentials higher than voltage potentials of the second signal range and the third signal range, and the third signal range includes voltage potentials lower than voltage potentials of the first signal range and the second signal range, the predetermined gain being negative when the analog input signal is in the first signal range, the predetermined gain being positive when the analog input signal is in the third signal range.

7. The ADC of claim 6 wherein the third reference input signal has a higher potential than potentials of the first and second reference input signals.

8. The ADC of claim 1 wherein the first capacitor is controllably coupled to receive a feedback signal from the output of the amplifier.

9. The ADC of claim 1 wherein at least one of the first reference input signal or the second reference input signal is a power supply signal.

10. The ADC of claim 1 wherein the first reference input signal and the second reference input signal are both ground signals.

11. The ADC of claim 1 wherein the third capacitor is further controllably coupled to the first reference input signal but not connected to the analog input signal, and wherein:
the first capacitor is coupled to the analog input signal during a first clock phase;
the second capacitor is coupled to the analog input signal during the first clock phase; and
the second capacitor is coupled to the first reference input signal during a second clock phase.

12. The ADC of claim 11 wherein:
the third capacitor is coupled to the first reference input signal during a first selected one of the first clock phase or the second clock phase; and
the third capacitor is coupled to the second reference input signal during a second selected one of the first clock phase or the second clock phase.

13. The ADC of claim 11 wherein:
the first capacitor is coupled to a feedback signal from the output of the amplifier during a second clock phase.

14. The ADC of claim 11 further comprising:
first and second switches, wherein the third capacitor is controllably coupled to the first reference input signal or the second reference input signal depending on conductive states of respective first and second switches; and
a control circuit for selecting a first set of states of the first and second switches during a first clock phase and for alternately selecting a second set of states of the first and second switches during the first clock phase.

15. The ADC of claim 1 comprised within an integrated circuit, wherein the predetermined scale factor is selectable after power is provided to the integrated circuit, the predetermined scale factor being selectable from a range of scale factors including a scale factor of one.

16. The ADC of claim 1 further comprising at least one RSD stage, each of the at least one RSD stage comprising a respective amplifier and a switched capacitor network.

17. The ADC of claim 1 further comprising a plurality of ADC stages coupled in series, each of the plurality of ADC stages including a respective amplifier and a switched capacitor network.

18. The ADC of claim 17 wherein the ADC is a cyclic analog-to-digital converter (ADC) and wherein each ADC stage is a redundant signed digit (RSD) stage.

19. The ADC of claim 17 further comprising a plurality of multiplying digital to analog converters (MDACs), each of the plurality of ADC stages including a respective one of the plurality of MDACs, each of the plurality of MDACs including a respective amplifier and switched capacitor network.

20. The ADC of claim 1 further comprising a multiplying digital to analog converter (MDAC), the MDAC including the amplifier and the switched capacitor network.

21. In an analog-to-digital converter (ADC), a processing and scaling circuit comprising:
an amplifier comprising an input and an output, the amplifier having operational range within a power supply range; and
a switched capacitor circuit coupled to the input of the amplifier and the output of the amplifier, the switched capacitor circuit comprising:
an analog signal input node for receiving an analog signal;
a reference input node for receiving a reference signal capable of having a value outside the operational range of the amplifier;
a plurality of capacitance elements, each of the plurality of capacitance elements being controllably coupled to the analog signal input node or the reference input node, or to both the analog signal input and the reference input node, and being controllably coupled to the input of the amplifier; wherein,
the amplifier and switched capacitor circuit, responsive to receiving the analog signal and the reference signal, scale the reference signal by a predetermined scale factor to provide a scaled reference signal within the operational range of the amplifier, and process the analog signal to provide an output signal having a predetermined gain of the analog signal adjusted by the predetermined scale factor of the reference signal, the switched capacitor circuit further comprising:
first, second and third capacitors, each having first and second terminals;
a first switch coupled between the first terminal of the first capacitor and the analog signal input node;
a second switch coupled between the first terminal of the second capacitor and the analog signal input node;
a third switch coupled between the first terminal of the second capacitor and a first power supply signal terminal; and
a fourth switch coupled between the first terminal of the third capacitor and the reference input node;
a fifth switch coupled between the input of the amplifier and at least one of the second terminals of the first, second and third capacitors; and
a sixth switch coupled between the first power supply signal terminal and at least one of the second terminals of the first, second and third capacitors.

22. The ADC of claim 21 wherein the first and second capacitors arm coupled to receive the analog signal and the third capacitor is not coupled to receive the analog signal.

23. The ADC of claim 21 wherein
the first, second and sixth switches are controlled to close the first, second and sixth switches during a first clock phase; and
the third and fifth switches are controlled to close the third and fifth switches during a second clock phase.

24. The ADC of claim 23 further comprising:
a seventh switch coupled between the first terminal of the third capacitor and the first power supply signal terminal; wherein,
the seventh switch is controlled to close the seventh switch during a first selected one of the first clock phase and the second clock phase; and
the fourth switch is controlled to close the fourth switch during a second selected one of the first clock phase and the second clock phase.

25. The ADC of claim 21 further comprising:
a seventh switch coupled between the first power supply signal terminal and the at least one of the second terminals of the first, second and third capacitors.

26. The ADC of claim 25 wherein
the sixth and fourth switches are controlled to close the sixth and fourth switches during a first clock phase; and
the first, second, third and seventh switches are controlled to close the first, second, third and seventh switches during a second clock phase.

27. The ADC of claim 26 wherein the reference signal is a first reference signal, the ADC further comprising:
an eighth switch coupled between the first terminal of the third capacitor and a second reference signal terminal; wherein,
the fifth switch is controlled to close the fifth switch during the first clock phase when the analog signal is in a first range; and
the eighth switch is controlled to close the eighth switch during the first clock phase when the analog signal is in a second range.

28. The ADC of claim 27 wherein
a second reference signal coupled to the second reference signal terminal has a lower potential than the first reference signal; and
the first range includes higher voltage potentials than the second range.

29. The ADC of claim 28 further comprising:
a ninth switch coupled between the first terminal of the third capacitor and the first power supply signal terminal, wherein the ninth switch is controlled to close during the first clock phase when the analog signal is in a third range, the third range including potentials lower than the first range and higher than the second range.

30. The ADC of claim 29 wherein the second reference signal and the power supply signal are coupled to ground potential.

31. The ADC of claim 21 wherein the switched capacitor circuit further comprises a feedback input node coupled to receive an amplifier feedback signal; and the first terminal of the first capacitor is controllably coupled to alternately receive the analog signal and the amplifier feedback signal.

32. The ADC of claim 21 wherein the predetermined scale factor is selected from a range of scale values including a scale value of one.

33. The ADC of claim 21 wherein the reference signal is one of a plurality of reference signals, the plurality of reference signals comprising a maximum power potential and a minimum power potential.

34. The ADC of claim 33 wherein the minimum power potential is ground potential.

35. The ADC of claim 21 wherein the reference signal is one of at least three reference signals, the at least three reference signals comprising a maximum reference signal, a minimum reference signal, and middle reference signal, the middle reference signal being at a potential between potentials of the maximum and minimum reference signals.

36. The ADC of claim 21 wherein the reference signal is one of a plurality of reference signals, the plurality of reference signals comprising first and second voltage signals configured for derivation from a bandgap voltage.

37. The ADC of claim 21 comprising:
first and second power supply inputs, wherein the amplifier is coupled to receive first and second power supply signals, and the reference signal is one of the first and second power supply signals.

38. In a system for analog-to-digital conversion, a method for processing an analog signal, the method comprising:
receiving an analog signal at an analog-to-digital conversion (ADC) stage;
receiving an unsealed reference signal at the ADC stage;
allowing a user of the system to control a predetermined scale factor;
generating a scaled reference signal from the unsealed reference signal by using the predetermined scale factor and a switched capacitance and amplification circuit of the ADC stage; and
generating and outputting a processed signal from the analog signal and the scaled reference signal by alternately coupling the analog signal and the unscaled reference signal to capacitors of the switched capacitance and amplification circuit.

39. A method of scaling a signal for use by a data converter, the method comprising:
receiving an input signal having a first operating range of voltages, the first operating range of voltages corresponding to a range between two power supply potentials;
receiving a reference potential;
providing the input signal and the reference potential to a switched capacitor network comprising switched capacitors and an amplifier;
scaling the reference potential by a predetermined scale factor determined by capacitive values within the switched capacitor network to provide a scaled reference signal within a second operating range of voltages, wherein voltages of the second operating range are substantially within the first operating range; and
processing the input signal also with the switched capacitor network to provide an output signal comprising a predetermined gain of the input signal adjusted by the scaled reference signal.

40. The method of claim 39 wherein the data converter comprises an analog-to-digital converter (ADC) and the input signal is an analog signal, the method further comprising:
converting the analog signal to a digital signal using the scaled reference signal.

41. The method of claim 39 further comprising:
allowing a user of the data converter to programmably control the predetermined scale factor.

* * * * *